(12) United States Patent
Itonaga

(10) Patent No.: US 11,038,140 B2
(45) Date of Patent: Jun. 15, 2021

(54) DISPLAY DEVICE, ELECTRONIC DEVICE, AND METHOD OF PRODUCING DISPLAY DEVICE

(71) Applicant: SONY CORPORATION, Tokyo (JP)

(72) Inventor: Kazuichiro Itonaga, Tokyo (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/481,629

(22) PCT Filed: Jan. 19, 2018

(86) PCT No.: PCT/JP2018/001612
§ 371 (c)(1),
(2) Date: Jul. 29, 2019

(87) PCT Pub. No.: WO2018/147048
PCT Pub. Date: Aug. 16, 2018

(65) Prior Publication Data
US 2019/0393441 A1    Dec. 26, 2019

(30) Foreign Application Priority Data
Feb. 13, 2017 (JP) .............................. JP2017-024414

(51) Int. Cl.
*H01L 51/52* (2006.01)
*H01L 27/32* (2006.01)
(Continued)

(52) U.S. Cl.
CPC ...... *H01L 51/5209* (2013.01); *H01L 27/3258* (2013.01); *H01L 51/5004* (2013.01); *H01L 51/56* (2013.01)

(58) Field of Classification Search
CPC ............ H01L 51/5209; H01L 27/3258; H01L 51/5004; H01L 51/56; H01L 27/3246; H05B 33/10; H05B 33/12; H05B 33/22
See application file for complete search history.

(56) References Cited

U.S. PATENT DOCUMENTS

2004/0070808 A1* 4/2004 Nakanishi ........... H01L 27/3276
359/245
2010/0193793 A1    8/2010 Moriwaki
(Continued)

FOREIGN PATENT DOCUMENTS

CN    101796619 A    8/2010
CN    102386206 A    3/2012
(Continued)

OTHER PUBLICATIONS

Ref.A ("Hydrophobicity, Hydrophilicity and Silanes," Paint and Coatings Industry 22(10):114, Sep. 2006) (Year: 2006).*
(Continued)

*Primary Examiner* — Yasser A Abdelaziez
(74) *Attorney, Agent, or Firm* — Chip Law Group

(57) ABSTRACT

There is provided a display device capable of decreasing a drive voltage. A display device includes: a first electrode provided for each of a plurality of light emitting elements arranged on a flat surface; at least two or more kinds of inorganic insulating layers which separate each of the light emitting elements and have different concentrations of hydroxy groups on surfaces of the layers; an organic light emitting layer provided on the first electrode and the two or more kinds of inorganic insulating layers; and a second electrode provided on the organic light emitting layer.

17 Claims, 18 Drawing Sheets

(51) Int. Cl.
*H01L 51/50* (2006.01)
*H01L 51/56* (2006.01)

(56) References Cited

U.S. PATENT DOCUMENTS

| | | |
|---|---|---|
| 2012/0049210 A1 | 3/2012 | Takagi |
| 2014/0077189 A1 | 3/2014 | Kugler et al. |
| 2014/0291668 A1 | 10/2014 | Morosawa |
| 2015/0200237 A1 | 7/2015 | Yim et al. |
| 2015/0280169 A1 | 10/2015 | Choi et al. |
| 2015/0303393 A1* | 10/2015 | Dai .................. H01L 27/3246 257/40 |

FOREIGN PATENT DOCUMENTS

| | | |
|---|---|---|
| CN | 103548165 A | 1/2014 |
| CN | 104078511 A | 10/2014 |
| CN | 104952903 A | 9/2015 |
| EP | 2695212 A1 | 2/2014 |
| JP | 2012-048906 A | 3/2012 |
| JP | 2012-182160 A | 9/2012 |
| JP | 2012-216338 A | 11/2012 |
| JP | 2014-514751 A | 6/2014 |
| JP | 2014-192418 A | 10/2014 |
| JP | 2015-149194 A | 8/2015 |
| KR | 10-2012-0022575 A | 3/2012 |
| KR | 10-2014-0034174 A | 3/2014 |
| KR | 10-2014-0118785 A | 10/2014 |
| KR | 10-2015-0084573 A | 7/2015 |
| KR | 10-2015-0111544 A | 10/2015 |
| TW | 201210014 A | 3/2012 |
| TW | 201249959 A | 12/2012 |
| TW | 201438202 A | 10/2014 |
| WO | 2009/057444 A1 | 5/2009 |
| WO | 2012/131314 A1 | 10/2012 |

OTHER PUBLICATIONS

Description JP2012048906A (Year: 2012).*
International Search Report and Written Opinion of PCT Application No. PCT/JP2018/001612, dated Apr. 10, 2018, 09 pages of ISRWO.

* cited by examiner

DISPLAY DEVICE, ELECTRONIC DEVICE, AND METHOD OF PRODUCING DISPLAY DEVICE

CROSS REFERENCE TO RELATED APPLICATIONS

This application is a U.S. National Phase of International Patent Application No. PCT/JP2018/001612 filed on Jan. 19, 2018, which claims priority benefit of Japanese Patent Application No. JP 2017-024414 filed in the Japan Patent Office on Feb. 13, 2017. Each of the above-referenced applications is hereby incorporated herein by reference in its entirety.

TECHNICAL FIELD

The present disclosure relates to a display device, an electronic device, and a method of producing the display device.

BACKGROUND ART

In recent years, in display devices for mobile applications, there has been an increasing demand for higher definition and lower power consumption.

For example, since a display device using an organic electro-luminescence diode (OLED) is a self-luminous type and has low power consumption, its use for mobile applications is expected.

For example, Patent Document 1 below discloses a technique in which, in a display device using an organic electro-luminescence diode, a light emitting region provided with the organic electro-luminescence diode can be more freely arranged. Furthermore, Patent Document 2 below discloses a technique in which, in a display device using an organic electro-luminescence diode, the leakage of drive current generated between adjacent organic electro-luminescence diodes is suppressed.

CITATION LIST

Patent Document

Patent Document 1: Japanese Patent Application Laid-Open No. 2015-149194
Patent Document 2: Japanese Patent Application Laid-Open No. 2012-216338 A

SUMMARY OF THE INVENTION

Problems to be Solved by the Invention

However, in the display devices disclosed in Patent Documents 1 and 2 described above, since the barrier when injecting holes from an anode electrode into the light emitting layer is high, the drive voltage is high. Consequently, it has been difficult to decrease the power consumption.

Thus, the present disclosure proposes a novel and improved display device, an electronic device, and a method of producing the display device, which can decrease the drive voltage.

Solutions to Problems

According to the present disclosure, there is provided a display device that includes: a first electrode provided for each of a plurality of light emitting elements arranged on a flat surface; at least two or more kinds of inorganic insulating layers which separate each of the light emitting elements and have different concentrations of hydroxy groups on surfaces of the layers; an organic light emitting layer provided on the first electrode and the two or more kinds of inorganic insulating layers; and a second electrode provided on the organic light emitting layer.

Furthermore, according to the present disclosure, there is provided an electronic device having a display unit that includes: first electrodes provided for each of a plurality of light emitting elements arranged on a flat surface; at least two or more kinds of inorganic insulating layers which separate each of the light emitting elements and have different concentrations of hydroxy groups on surfaces of the layers; an organic light emitting layer provided on the first electrodes and the two or more kinds of inorganic insulating layers; and a second electrode provided on the organic light emitting layer.

Furthermore, according to the present disclosure, there is provided a method of producing a display device, including the steps of: respectively forming first electrodes on a flat surface; forming, between the first electrodes, a second inorganic insulating layer which protrudes further than the first electrodes; forming an inorganic insulating material layer having a higher concentration of hydroxy groups on a surface than a concentration of hydroxy groups on a surface of the second inorganic insulating layer, on the first electrodes and the second inorganic insulating layer; anisotropically etching the inorganic insulating material layer to form a first inorganic insulating layer along a side surface of the second inorganic insulating layer; forming an organic light emitting layer on the first electrodes, the first inorganic insulating layer, and the second inorganic insulating layer; and forming a second electrode on the organic light emitting layer.

According to the present disclosure, a channel in which carriers are accumulated at the interface between the inorganic insulating layer and the organic layer is formed, so that current can be easily flowed from the first electrode to the channel.

Effects of the Invention

As described above, according to the present disclosure, it is possible to provide a display device and an electronic device in which the drive voltage is further decreased.

Note that the effects mentioned above are not necessarily limitative ones, and any one of the effects described in the present specification or other effects that can be grasped from the present specification may be exhibited, along with the effects mentioned above or instead of the effects mentioned above.

MODE FOR CARRYING OUT THE INVENTION

Figure 1:
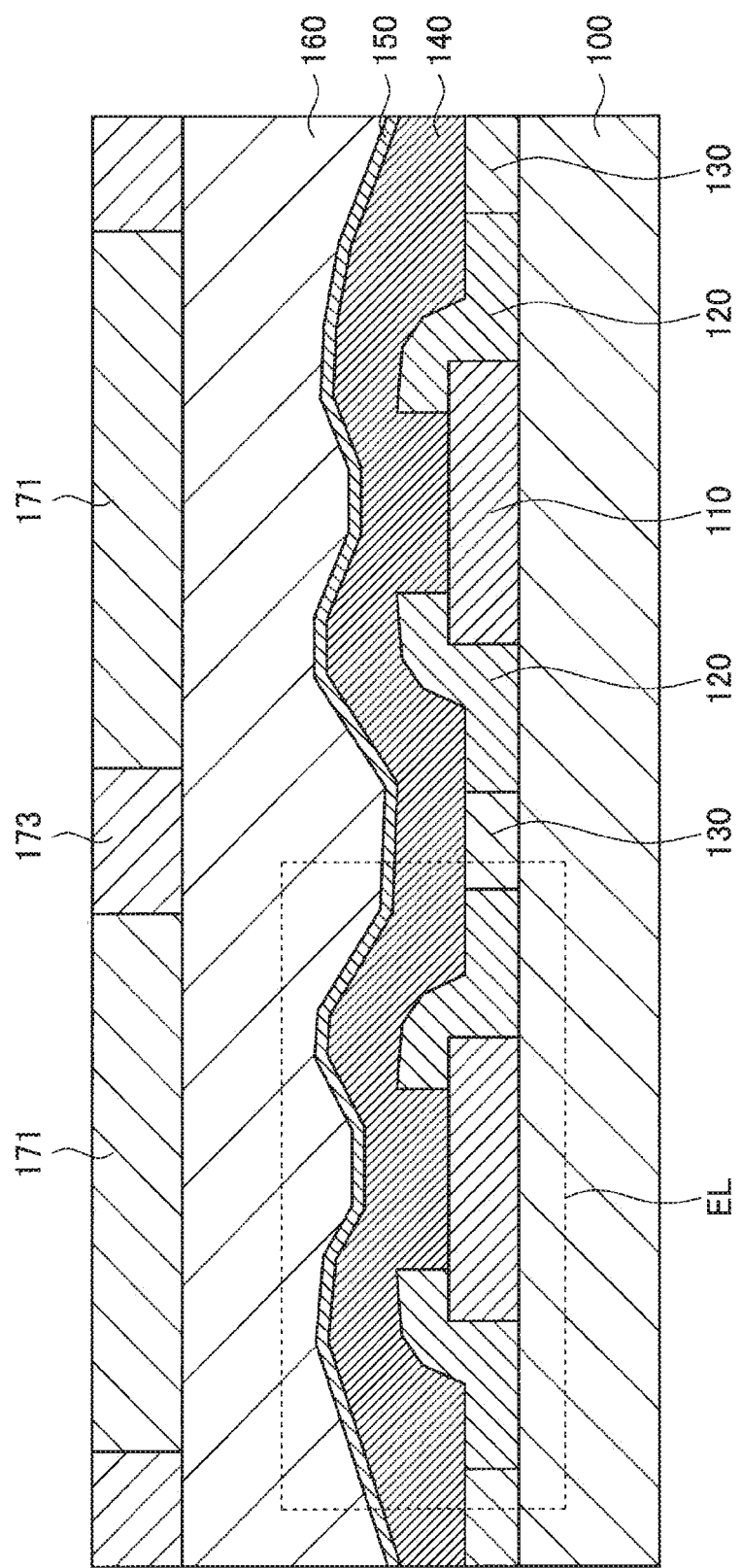
FIG. 1 is a cross-sectional view of light emitting elements cut in a stacking direction which are included in a display device according to a first configuration of the present disclosure.

Hereinafter, preferred embodiments of the present disclosure will be described in detail with reference to the accompanying drawings. Note that, in the present specification and the drawings, components having substantially the same functional configuration will be denoted by the same reference numerals to omit redundant description.

Note that the description will be given in the following order.
1. Configuration of Display Device
　1.1. First Configuration
　1.2. Second Configuration
　1.3. Specific Example
　1.4. Modified Example
2. Method of Producing Display Device
3. Application Examples of Display Device 1. Configuration of Display Device First, the whole configuration of the display device according to an embodiment of the present disclosure will be described.

The display device according to this embodiment is, for example, a display device that displays an image or the like by controlling light emission of each of a plurality of light emitting elements arranged on a flat surface. For example, each of the plurality of light emitting elements arranged on the flat surface forms one of red, green, and blue sub-pixels, and the three sub-pixels gather to form one pixel (in other words, a picture element). The display device according to this embodiment controls light emission of the three sub-pixels constituting the pixel to control the color of each of the pixels, and displays an image based on an image signal.

Note that, in the display device according to this embodiment, an arbitrary configuration can be used for a drive circuit that controls light emission of each of the light emitting elements, a power circuit that supplies power to the light emitting elements, and the like. Therefore, only the configuration of the light emitting elements of the display device according to this embodiment will be specifically described below, and illustration and description of the drive circuit, the power circuit, and the like will be omitted.

1.1. First Configuration

Next, a first configuration of the display device according to this embodiment will be described with reference to FIG. 1. FIG. 1 is a cross-sectional view of light emitting elements cut in a stacking direction which are included in the display device according to the first configuration of this embodiment.

As illustrated in FIG. 1, the light emitting elements include: a substrate 100, first electrodes 110 provided on the substrate 100 for each of the light emitting elements; a first inorganic insulating layer 120 and a second inorganic insulating layer 130 which separate each of the first electrodes 110; an organic light emitting layer 140 provided on the first electrodes 110, the first inorganic insulating layer 120, and the second inorganic insulating layer 130; a second electrode 150 provided on the organic light emitting layer 140; a protective layer 160 provided on the second electrode 150; and a color filter 171 and a shielding layer 173 which are provided on the protective layer 160.

In other words, the display device according to this embodiment is a top emission type display device that extracts light emitted from the light emitting element, from the side of the protective layer 160. However, it goes without saying that the display device according to this embodiment may be a bottom emission type display device that extracts light emitted from the light emitting element, from the side of the substrate 100.

The substrate 100 is a support that supports a plurality of light emitting elements arranged on one main surface. Furthermore, although not illustrated, the substrate 100 may be provided with a drive circuit for controlling driving of the light emitting elements which includes a sampling transistor and a driving transistor, a power circuit which supplies power to the light emitting elements, and the like.

The substrate 100 may include, for example, glass or resin having low moisture and low oxygen permeability, or may include a semiconductor with which a transistor or the like can be easily formed. Specifically, the substrate 100 may be a glass substrate such as high strain point glass, soda glass, borosilicate glass, forsterite, lead glass or quartz glass, or a resin substrate such as polymethyl methacrylate, polyvinyl alcohol, polyvinyl phenol, polyether sulfone, polyimide, polycarbonate, polyethylene terephthalate or polyethylene naphthalate, or may be a semiconductor substrate such as amorphous silicon or polycrystalline silicon.

The first electrode 110 is provided on the substrate 100 for each of the light emitting elements, and serves as an anode of the light emitting elements. Specifically, the first electrode 110 may include a material having a high light reflectance and a large work function as a light reflection electrode. For example, the first electrode 110 may include a simple metal or an alloy of metals such as chromium (Cr), gold (Au), platinum (Pt), nickel (Ni), copper (Cu), molybdenum (Mo), tungsten (W), titanium (Ti), tantalum Ta), aluminum (Al), iron (Fe), silver (Ag), or may include a stacked film of a plurality of layers of these metals. Furthermore, the first electrode 110 may be formed as a transparent electrode using a transparent conductive material such as indium zinc oxide or indium tin oxide. In such a case, a light reflecting layer including a single metal or an alloy of metals such as Cr, Au, Pt, Ni, Cu, Mo, W, Ti, Ta, Al, Fe or Ag may be provided between the first electrode 110 and the substrate 100.

The first inorganic insulating layer 120 and the second inorganic insulating layer 130 are provided between the respective adjacent light emitting elements in order to separate each of the light emitting elements. Furthermore, the first inorganic insulating layer 120 and the second inorganic insulating layer 130 are formed so as to have different concentrations of hydroxy groups on the surfaces of the insulating layers. Specifically, the first inorganic insulating layer 120 is formed so as to have a higher concentration of hydroxy groups than a concentration of hydroxy groups of the second inorganic insulating layer 130.

As a result, the first inorganic insulating layer 120 and the second inorganic insulating layer 130 can form a flow path (i.e., a channel) in which the short circuit of the first electrodes 110 of each of the adjacent light emitting elements is prevented and the current from the first electrodes 110 flows to the organic light emitting layer 140.

Figure 2:
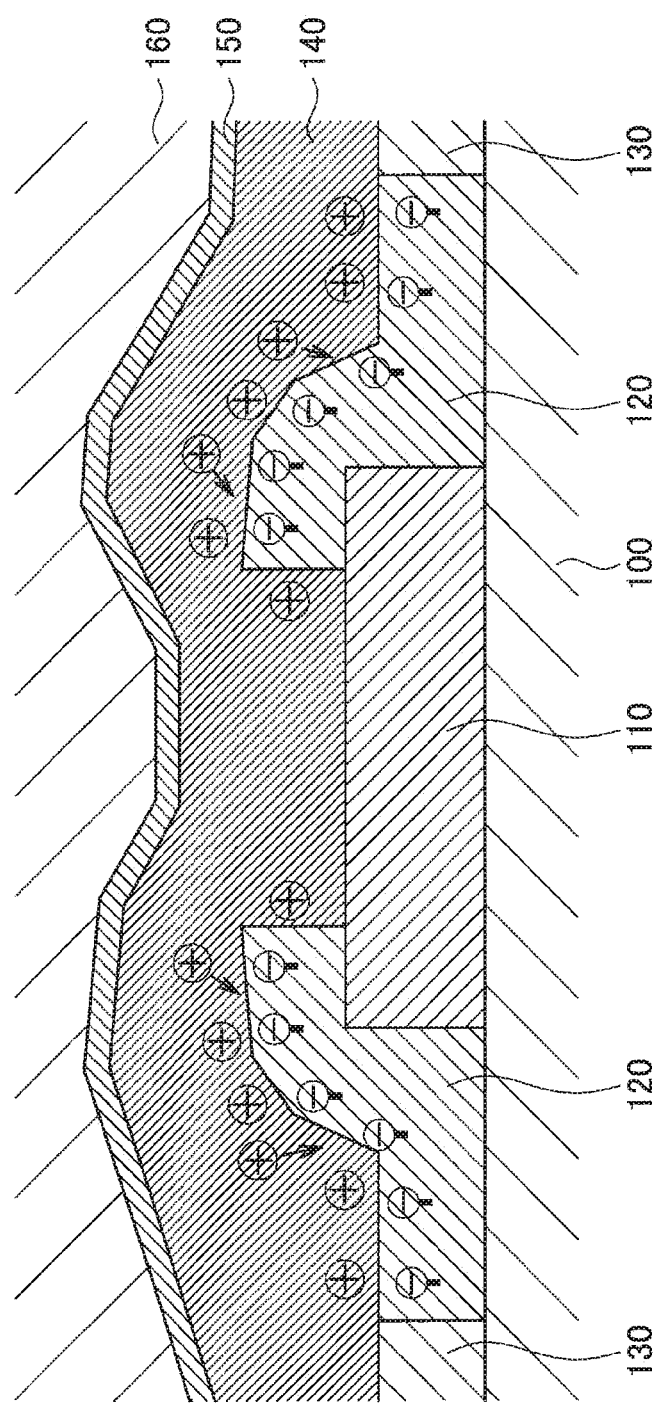
FIG. 2 is an enlarged sectional view of a region EL illustrating one of the light emitting elements of FIG. 1.

Here, the channel formation by the first inorganic insulating layer 120 and the second inorganic insulating layer 130 will be described with reference to FIG. 2. FIG. 2 is an enlarged sectional view of a region EL illustrating one of the light emitting elements of FIG. 1.

As illustrated in FIG. 2, since hydroxy groups are likely to be negatively charged, the surface of the first inorganic insulating layer 120 having a high concentration of hydroxy groups is negatively charged. Thus, holes having a positive charge are attracted to the interface of the organic light emitting layer 140 in contact with the first inorganic insulating layer 120 by an electrostatic force, and the holes accumulate at the interface. In the region with the holes accumulated, the holes serves as free carriers, as a result of which the region can serve as a low-resistance conductive path through which current can flow.

In other words, the first inorganic insulating layer 120 having a high concentration of hydroxy groups can form a conductive path (in other words, a channel) in which holes have accumulated at the interface of the organic light emitting layer 140 in contact with the first inorganic insulating layer 120. The channel formed at the interface of the organic light emitting layer 140 has a low resistance and can lower the barrier of hole injection from the first electrode 110 to the organic light emitting layer 140, so that it is possible to decrease the drive voltage of the light emitting element and to decrease the power consumption of the light emitting element.

At this time, in the light emitting element illustrated in FIG. 2, the light emitting region is a region in which the first electrode 110 and the first inorganic insulating layer 120 are formed. This is because the current flows through the channel formed at the interface of the organic light emitting layer 140 in contact with the first inorganic insulating layer 120 in a similar manner to the first electrode 110, and thus the channel serves as a pseudo electrode, whereby holes can be injected into the organic light emitting layer 140, similarly to the first electrode 110.

Meanwhile, since the surface of the second inorganic insulating layer 130 having a lower concentration of hydroxy groups than the concentration of hydroxy groups of the first inorganic insulating layer 120 is not negatively charged, holes are not attracted to the interface of the organic light emitting layer 140 in contact with the second inorganic insulating layer 130 and no channel is formed. Therefore, the channel formed at the interface of the organic light emitting layer 140 in contact with the first inorganic insulating layer 120 is interrupted at the interface of the organic light emitting layer 140 in contact with the second inorganic insulating layer 130. Accordingly, the second inorganic insulating layer 130 can prevent the current from leaking due to the continuous formation of the channel between the adjacent first electrodes 110.

Here, the first inorganic insulating layer 120 specifically includes an inorganic oxide so that it is possible to increase the concentration of hydroxy groups. In a case where the first inorganic insulating layer 120 includes an inorganic oxide, part of oxygen contained in the first inorganic insulating layer 120 is likely to form hydroxyl groups, through abstraction of hydrogen from an organic compound or moisture for stabilization. Therefore, the first inorganic insulating layer 120 includes an inorganic oxide, so that the layer can include a higher concentration of hydroxy groups.

For example, the first inorganic insulating layer 120 may include silicon oxide ($SiO_x$) or silicon oxynitride (SiON). More specifically, the first inorganic insulating layer 120 may include a silicon oxide or silicon oxynitride film formed by chemical vapor deposition (CVD) using low temperature plasma, atomic layer deposition (ALD) or the like.

A film formed using a low temperature plasma is prone to defects because the bonding between atoms is relatively weak, and thus the generation of unstable oxygen is likely to occur. Therefore, in the film formed using a low temperature plasma, the hydroxy group is likely to be formed in the subsequent production step. Since the first inorganic insulating layer 120 formed using the low temperature plasma has a higher concentration of hydroxy groups and can be more negatively charged, it is possible to form a channel with high electrical conductivity in the organic light emitting layer 140.

Furthermore, the concentration of hydroxy groups in the first inorganic insulating layer 120 can also be increased by introducing at least one of an oxygen atom or a hydrogen atom into a layer including an inorganic insulating material other than an inorganic oxide. Moreover, the concentration of hydroxy groups in the first inorganic insulating layer 120 can be further increased by introducing at least one of an oxygen atom or a hydrogen atom into the first inorganic insulating layer 120 including an inorganic oxide.

Since the hydroxy group has a relatively stable structure, the oxygen atom or hydrogen atom contained in the first inorganic insulating layer 120 is bound to the oxygen atom or hydrogen atom in the raw material used in the subsequent production step (for example, oxygen gas at the asking step, an organic raw material of the organic light emitting layer 140, etc.), whereby the hydroxy group is likely to be formed. Accordingly, even in a case where at least one of an oxygen atom or a hydrogen atom is introduced into the first inorganic insulating layer 120 later, it is possible to allow the first inorganic insulating layer 120 to contain a high concentration of hydroxy groups.

Ion doping of oxygen ions or hydrogen ions may be used for introducing oxygen atoms or hydrogen atoms into the first inorganic insulating layer 120, and a plasma exposure process with a compound gas containing either oxygen or hydrogen may be used. For example, hydrogen atoms may be introduced into the first inorganic insulating layer 120 by ion doping the first inorganic insulating layer 120 with hydrogen ions.

Note that, in a case where oxygen atoms or hydrogen atoms are introduced into the first inorganic insulating layer 120, the introduced oxygen atoms or hydrogen atoms are distributed unevenly on the surface of the first inorganic insulating layer 120. The concentration of hydroxy groups on the surface of the first inorganic insulating layer 120 contributes more strongly to the formation of a channel at the interface of the organic light emitting layer 140, so that it is possible to more efficiently form a channel at the interface of the organic light emitting layer 140 by introducing oxygen or hydrogen atoms into the first inorganic insulating layer 120.

Meanwhile, the second inorganic insulating layer 130 specifically includes an inorganic nitride, so that it is possible to decrease the concentration of hydroxy groups. The bond formed by nitrogen has a higher binding energy than the bond formed by oxygen and is stable, whereby unstable bonds to form hydroxy groups are less likely to occur in the second inorganic insulating layer 130 including an inorganic nitride, and hydroxy groups are less likely to be formed in the subsequent production step. Therefore, the second inorganic insulating layer 130 includes an inorganic nitride, so that it is possible to decrease the concentration of hydroxy groups.

For example, the second inorganic insulating layer 130 may include silicon nitride ($SiN_x$). More specifically, the second inorganic insulating layer 130 may include a silicon nitride film formed by low temperature plasma CVD in which the ratio of hydrogen atoms contained in the source gases (for example, $SiH_4$ and $NH_3$) is reduced.

Furthermore, the second inorganic insulating layer 130 may include an inorganic insulating material other than the inorganic nitride as long as the concentration of hydroxy groups can be decreased. For example, the second inorganic insulating layer 130 may include aluminum oxide ($Al_2O_3$) which has a higher binding energy of each of constituent atoms and is less likely to generate unstable oxygen atoms as a hydroxy group.

Moreover, the concentration of hydroxy groups in the second inorganic insulating layer 130 can also be decreased by introducing at least one of a nitrogen atom or a fluorine atom into a layer including another inorganic insulating material. This is because a nitrogen atom or a fluorine atom forms a strong bond with another atom such as a silicon atom, and thus is introduced into the second inorganic insulating layer 130; as a result, bonds of atoms constituting the second inorganic insulating layer 130 can be stabilized. According to this, since the second inorganic insulating layer 130 can reduce unstable bonds which may cause the formation of hydroxy groups in the subsequent production step, the concentration of hydroxy groups can be reduced.

In particular, a fluorine atom can form a strong bond with a silicon atom or the like, whereby the bonds of atoms constituting the second inorganic insulating layer 130 are further stabilized, and the unstable bonds are further reduced.

Furthermore, the second inorganic insulating layer 130 is annealed after at least one of a fluorine atom or a nitrogen atom is introduced, whereby the second inorganic insulating layer 130 is made to have a low concentration of hydroxy groups even in a case where the layer includes an inorganic oxide.

This is because, in the annealing step, the atomic bonds in the second inorganic insulating layer 130 can be replaced with chemically more stable bonds by heating. In other words, even in a case where the second inorganic insulating layer 130 includes an inorganic oxide, the atomic bonds in the second inorganic insulating layer 130 can be replaced with chemically more stable bonds by performing annealing after introducing either a fluorine atom or a nitrogen atom. According to this, it is possible to further stabilize the bonds of atoms constituting the second inorganic insulating layer 130, so that the second inorganic insulating layer 130 can reduce unstable bonds which may cause the formation of hydroxy groups in the subsequent production step and thus can reduce the concentration of hydroxy groups.

Ion doping of fluorine ions or nitrogen ions as well as the plasma exposure process with a compound gas containing either fluorine atoms or nitrogen atoms may be used in order to introduce fluorine atoms or nitrogen atoms into the second inorganic insulating layer 130. For example, fluorine atoms or nitrogen atoms may be introduced into the second inorganic insulating layer 130 by subjecting the second inorganic insulating layer 130 to a plasma exposure process with nitrogen gas or silane gas.

The organic light emitting layer 140 includes an organic light emitting material and is provided on the first electrode 110, the first inorganic insulating layer 120, and the second inorganic insulating layer 130, continuously over the plurality of light emitting elements. Furthermore, the organic light emitting layer 140 emits light when an electric field is applied between the first electrode 110 and the second electrode 150.

Specifically, in a case where an electric field is applied, holes are injected into the organic light emitting layer 140 from both the first electrode 110 and the channel formed at the interface of the organic light emitting layer 140 with the first inorganic insulating layer 120, and electrons are injected from the second electrode 150. The injected holes and electrons recombine in the organic light emitting layer 140 to form an exciton, and the energy of the exciton excites the organic light emitting material. As a result, fluorescence or phosphorescence is generated from the organic light emitting material.

The organic light emitting layer 140 may be formed to have a thickness of 100 nm to 300 nm, for example, in a multilayer structure in which a plurality of functional layers is stacked. Specifically, the organic light emitting layer 140 may have a structure in which a hole injection layer, a hole transport layer, a light emitting layer, an electron transport layer, and an electron injection layer are sequentially stacked from the side of the first electrode 110. Furthermore, the organic light emitting layer 140 may be formed in a so-called tandem structure in which a plurality of light emitting layers is connected via a charge generation layer or an intermediate electrode.

The hole injection layer and the hole transport layer include a hole transport material and enhance the injection efficiency of holes from the first electrode 110.

For example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, or stilbene, or derivatives thereof may be used as the hole transport material.

More specifically, α-naphthylphenylphenylenediamine (α-NPD), porphyrin, metal tetraphenylporphyrin, metal naphthalocyanine, hexacyanoazatriphenylene (HAT), 7,7,8,-tetracyanoquinodimethane (TCNQ), 7,7,8,8-tetracyano-2,3,5,6-tetrafluoroquinodimethane (F4-TCNQ), tetracyano-4,4,4-tris (3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene or the like may be used as the hole transport material.

The light emitting layer contains at least one or more of a hole transport material, an electron transport material or a both charge transport material, each of which is a host material, and a fluorescent or phosphorescent organic light emitting material which is a dopant material, and the light emitting layer converts electric energy into light energy.

For example, styryl derivatives, anthracene derivatives, naphthacene derivatives, carbazole derivatives, aromatic amine derivatives, phenanthroline derivatives, triazole derivatives, quinolinolato-based metal complexes, phenanthroline derivatives or the like may be used as the host material.

Furthermore, a known fluorescent material and phosphorescent material may be used as the dopant material (organic light emitting material). For example, dye materials (such as styryl benzene-based dyes, oxazole-based dyes, perylene-based dyes, coumarin-based dyes, and acridine-based dyes), polyaromatic hydrocarbon dyes (such as anthracene derivatives, naphthacene derivatives, pentacene derivatives, and chrysene derivatives), pyrromethene skeleton materials, quinacridone-based derivatives, cyanomethylenepyran-based derivatives, benzothiazole-based derivatives, benzoimidazole-based derivatives, metal chelated oxinoid compounds or the like may be used as the known fluorescent material. Furthermore, for example, an organometallic complex containing at least one metal selected from ruthenium (Ru), rhodium (Rh), palladium (Pd), silver (Ag), rhenium (Re), osmium (Os), iridium (Ir), platinum (Pt), and gold (Au) may be used as the known phosphorescent material. More specifically, complexes such as $Ir(ppy)_3$ having a noble metal element such as Ir as a central metal, complexes such as $Ir(bt)_2.acac_3$, and complexes such as $PtOEt_3$ may be used as the phosphorescent material.

Furthermore, the light emitting layer may emit light corresponding to each color of the display device instead of white. For example, a red light emitting layer which emits red light can be formed by mixing 30% by mass of 2,6-bis[(4'-methoxydiphenylamino) styryl]-1,5-dicyanonaphtha-lene (BSN) with 4,4-bis(2,2-diphenylbinin)biphenyl (DPVBi). Furthermore, a green light emitting layer which emits green light can be formed by mixing coumarin 6 with 5% by mass of DPVBi. Moreover, a blue light emitting layer which emits blue light can be formed by mixing 2.5% by mass of 4,4'-bis[2-{4-(N,N-diphenylamino)phenyl}vinyl] biphenyl (DPAVBi) with DPVBi.

The electron transport layer contains an electron transport material and enhances the injection efficiency of electrons from the second electrode 150.

For example, tris(8-quinolinolato)aluminum ($Alq_3$), a compound having a nitrogen-containing aromatic ring, and the like may be used as the electron transport material. More specifically, the aforementioned tris(8-quinolinolato)aluminum ($Alq_3$), 2,9-dimethyl-4,7-diphenyl-1,10-phenanthroline (BCP) or bathophenanthroline (Bphen) may be used as the electron transport material. Note that the electron transport layer may include a plurality of layers. In a case where the electron transport layer may include the plurality of layers, the electron transport layer may further include a layer doped with an alkali metal element or an alkaline earth metal element.

The electron injection layer enhances the injection efficiency of electrons from the second electrode 150. The electron injection layer may include, for example, lithium fluoride (LiF), sodium chloride (NaCl), cesium fluoride (CsF), lithium oxide ($Li_2O$), barium oxide (BaO) or the like.

The second electrode 150 serves as a cathode of the light emitting element, and is provided on the organic light emitting layer 140 continuously over the plurality of light emitting elements. Specifically, the second electrode 150 may include a material having high light transmittance and a small work function as a light transmitting electrode. For example, the second electrode 150 may include a transparent conductive material such as indium tin oxide, indium zinc oxide, zinc oxide, aluminum-doped zinc oxide or gallium-doped zinc oxide, or may include a thin film of an alloy of metals such as aluminum (Al), magnesium (Mg), silver (Ag), calcium (Ca) or sodium (Na) which is thin to the extent of having light transmittance (for example, 30 nm or less). Furthermore, the second electrode 150 may include a stacked film of a plurality of layers of the metals or alloys mentioned above.

The protective layer 160 is provided on the second electrode 150 to prevent moisture and oxygen from entering the organic light emitting layer 140. Furthermore, the protective layer 160 improves the mechanical strength of the display device. Specifically, the protective layer 160 may include a material having high light transmittance and low water permeability. For example, the protective layer 160 may include silicon oxide ($SiO_x$), silicon nitride ($SiN_x$), aluminum oxide ($AlO_x$) or a combination thereof.

The color filter 171 and the shielding layer 173 define pixels or sub-pixels of the display device.

Specifically, the color filter 171 may be a red filter, a green filter, and a blue filter. According to the color filter 171, light emitted from the light emitting element can be separated by color and extracted. The color filter 171 may include, for example, a resin containing a pigment or a dye. The shielding layer 173 may be a black matrix patterned in a matrix according to the arrangement of pixels or sub-pixels of the display device. According to the shielding layer 173, the contrast of the display device can be improved by shielding unnecessary external light and the like reflected by wiring or the like between the pixels or the sub-pixels. The shielding layer 173 may include, for example, a black material such as chromium (Cr) or graphite.

Furthermore, a meniscus lens for each of the light emitting elements may be provided between the color filter 171 and the shielding layer 173, and the protective layer 160. The meniscus lens is a lens in which one surface of the lens is flat and the other surface is convex. The central portion of the meniscus lens is thicker than the peripheral portion and the lens can serve as a condensing lens. Consequently, the display device condenses light for each of the light emitting elements, thereby preventing the occurrence of color mixing between the light emitting elements.

As described above, in the display device according to the first configuration, the first inorganic insulating layer 120 can form a channel which has a low barrier for hole injection from the first electrode 110 to the organic light emitting layer 140 and serves as a conductive path through which current flows. Therefore, in the display device according to the first configuration, the power consumption can be decreased by decreasing the drive voltage of the light emitting elements.

Furthermore, the display device according to the first configuration can use a region in which the first inorganic insulating layer 120 is formed in addition to the first electrode 110 as the light emitting region. Thus, the aperture of each of the picture elements is increased, so that the brightness of the display device can be improved.

1.2. Second Configuration

Figure 3:
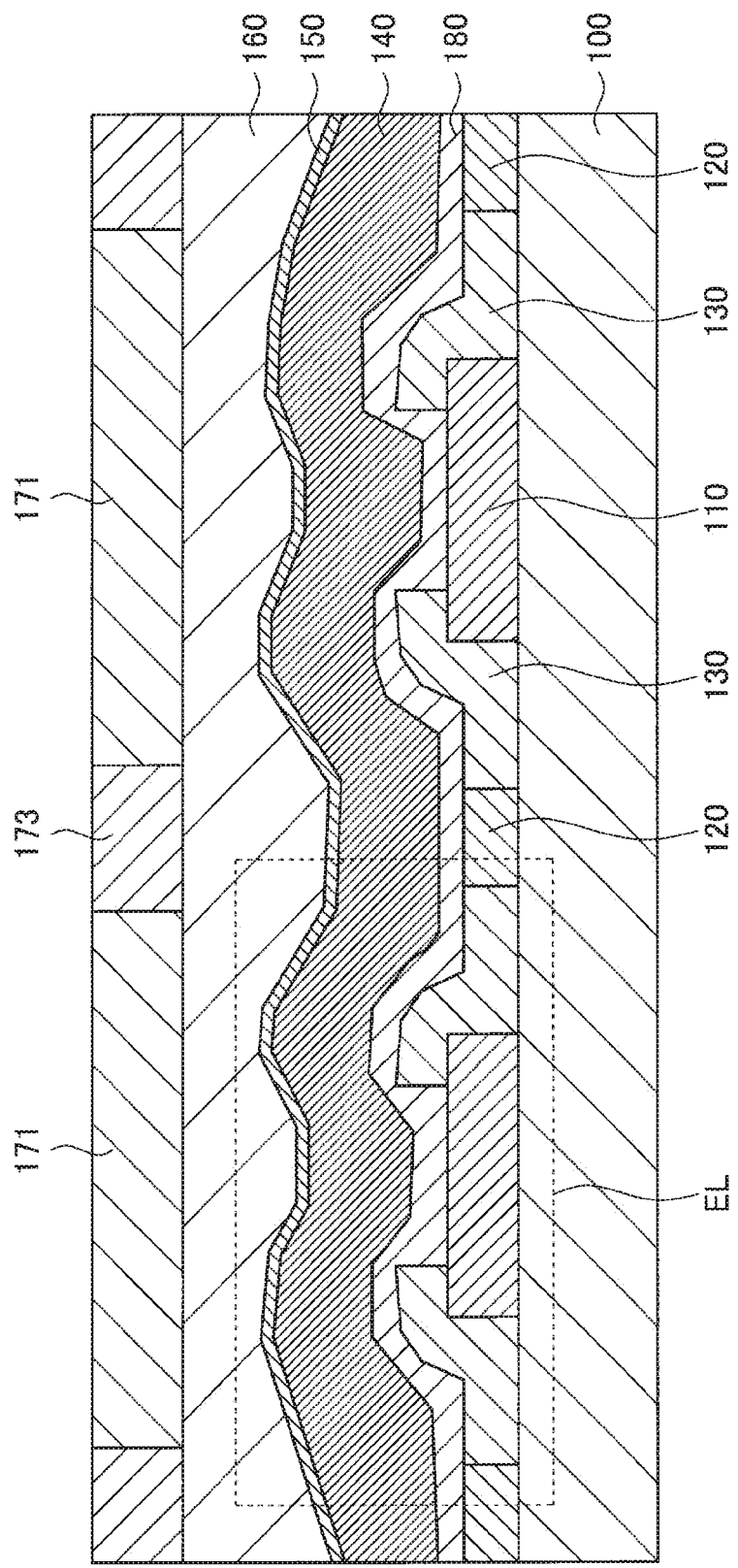
FIG. 3 is a cross-sectional view of light emitting elements cut in a stacking direction which are included in a display device according to a second configuration of the present disclosure.

Next, a second configuration of the display device according to this embodiment will be described with reference to FIG. 3. FIG. 3 is a cross-sectional view of light emitting elements cut in a stacking direction which are included in the display device according to the second configuration of this embodiment.

As illustrated in FIG. 3, the light emitting elements include: the substrate 100, the first electrodes 110 provided on the substrate 100 for each of the light emitting elements; the first inorganic insulating layer 120 and the second inorganic insulating layer 130 which separate each of the first electrodes 110; an electron accumulation layer 180 provided on the first electrodes 110, the first inorganic insulating layer 120, and the second inorganic insulating layer 130; the organic light emitting layer 140 provided on the electron accumulation layer 180; the second electrode 150 provided on the organic light emitting layer 140; the protective layer 160 provided on the second electrode 150; and the color filter 171 and the shielding layer 173 which are provided on the protective layer 160.

In other words, in the light emitting element according to the second configuration, the arrangement of the first inorganic insulating layer 120 and the second inorganic insulating layer 130 is replaced with respect to the first configuration. Furthermore, the light emitting element according to the second configuration is different from the first configuration in that the electron accumulation layer 180 is provided between the first electrode 110, the first inorganic insulating layer 120 and the second inorganic insulating layer 130, and the organic light emitting layer 140.

Note that the substrate 100, the first electrode 110, the organic light emitting layer 140, the second electrode 150, the protective layer 160, the color filter 171, and the shielding layer 173 are substantially similar to the first configuration, and thus the description thereof will be omitted.

The electron accumulation layer 180 tends to accumulate electrons that can be free carriers. Specifically, the electron accumulation layer 180 include a material in which an absolute value of a LUMO level is larger than an absolute value of a HOMO level of the layer (for example, the hole transport layer) in contact with the electron accumulation layer 180 of the organic light emitting layer 140, and is larger than a work function of a material that forms the first electrode 110. Such a potential diagram is included, whereby the electron accumulation layer 180 easily traps electrons. Consequently, the layer can serve as the conductive path (i.e., a channel) in which electrons are converted into free carriers.

For example, the electron accumulation layer 180 can include a material containing Li.

Figure 4:
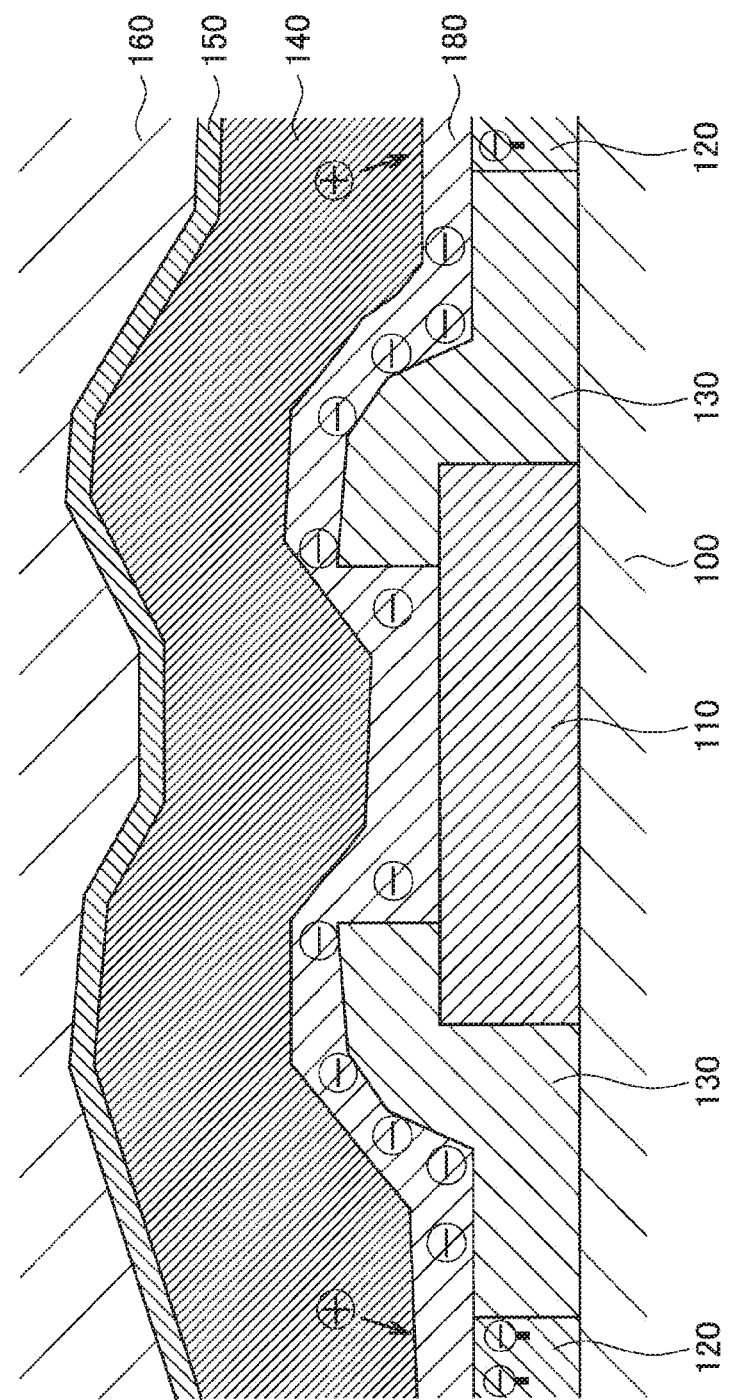
FIG. 4 is an enlarged sectional view of a region EL illustrating one of the light emitting elements of FIG. 3.

Here, the channel formation by the electron accumulation layer 180 mentioned above will be described with reference to FIG. 4. FIG. 4 is an enlarged sectional view of a region EL illustrating one of the light emitting elements of FIG. 3.

As illustrated in FIG. 4, electrons are accumulated in the electron accumulation layer 180 according to the potential diagram, whereby a channel having electrons as carriers is formed. However, since the first inorganic insulating layer 120 is negatively charged with a high concentration of hydroxy groups, in the electron accumulation layer 180 in contact with the first inorganic insulating layer 120, holes attracted to the negatively charged first inorganic insulating layer 120 are combined with the accumulated electrons. This results in the disappearing of the carriers. Therefore, the channel formed in the electron accumulation layer 180 is interrupted at the interface in contact with the first inorganic insulating layer 120. Accordingly, the first inorganic insulating layer 120 can prevent the current from leaking due to the continuous formation of the channel between the adjacent first electrodes 110.

Meanwhile, the second inorganic insulating layer 130 has a low concentration of hydroxy groups and is not negatively charged, whereby the layer does not attract holes. Therefore, in the electron accumulation layer 180 in contact with the second inorganic insulating layer 130, a channel is formed because electrons serving as carriers do not disappear. According to this, the channel formed in the electron accumulation layer 180 can lower the barrier of hole injection from the first electrode 110 to the organic light emitting layer 140, so that it is possible to decrease the drive voltage of the light emitting element and to decrease the power consumption of the light emitting element.

Note that, in a case where the amount of electrons accumulated in the electron accumulation layer 180 is excessive, the electrons may not be completely neutralized by the holes attracted to the first inorganic insulating layer 120 in the electron accumulation layer 180 in contact with the first inorganic insulating layer 120. In such a case, since the channel is not interrupted in the electron accumulation layer 180 in contact with the first inorganic insulating layer 120, current leakage may occur between the adjacent first electrodes 110.

Therefore, in the region in which the electron accumulation layer 180 is in contact with the first inorganic insulating layer 120, the amount of electrons to be accumulated is preferably controlled so that no channel is formed. The amount of electrons to be accumulated in the electron accumulation layer 180 can be controlled by, for example, the film thickness of the electron accumulation layer 180 and the potential diagram of the electron accumulation layer 180 and the layer adjacent to the electron accumulation layer 180 (in other words, a relationship between the HOMO level and the LUMO level of each of the layers).

As described above, in the display device according to the second configuration, the electron accumulation layer 180 can form a channel which has a low barrier for hole injection from the first electrode 110 and serves as a conductive path through which current flows. Therefore, in the display device according to the second configuration, the power consumption can be decreased by decreasing the drive voltage of the light emitting element.

Furthermore, the display device according to the second configuration can use a region in which the second inorganic insulating layer 130 is formed in addition to the first electrode 110 as the light emitting region. Thus, the aperture of each of the picture elements is increased, so that the brightness of the display device can be improved.

1.3. Specific Example

Figure 5:
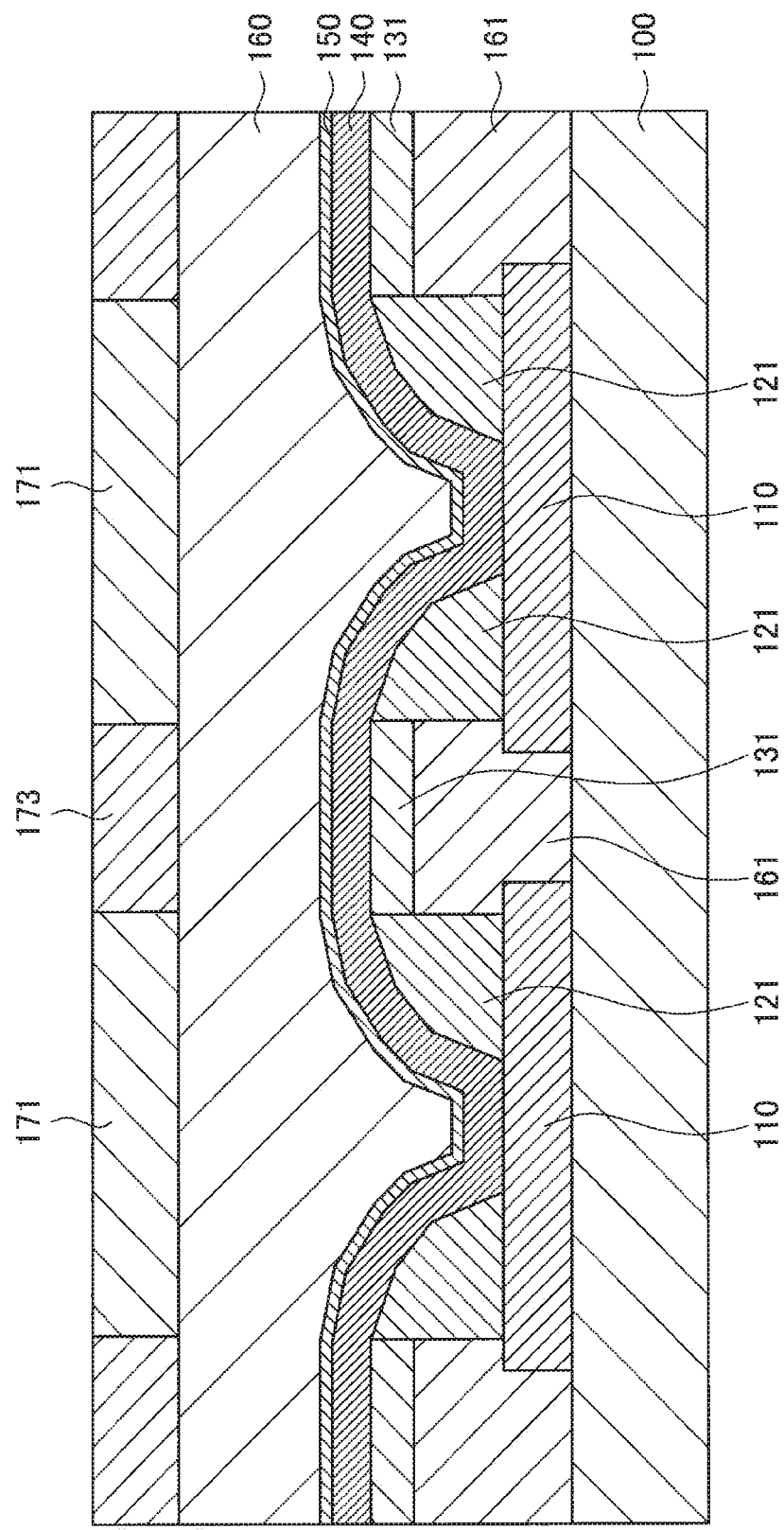
FIG. 5 is a cross-sectional view of light emitting elements cut in a stacking direction which are included in a display device according to a specific example of the present disclosure.

Subsequently, a specific example of the display device according to this embodiment will be described with reference to FIG. 5. FIG. 5 is a cross-sectional view of light emitting elements cut in a stacking direction which are included in the display device according to the specific example of this embodiment.

As illustrated in FIG. 5, the light emitting elements include: the substrate 100; the first electrodes 110 provided on the substrate 100 for each of the light emitting elements; channel formation layers 121 provided on the first electrodes 110; the organic light emitting layer 140 provided on the first electrodes 110 and the channel formation layers 121, the second electrode 150 provided on the organic light emitting layer 140, and the protective layer 160 provided on the second electrode 150; and the color filter 171 and the shielding layer 173 which are provided on the protective layer 160. Furthermore, an insulating layer 161 is provided between the respective light emitting elements, and a channel block layer 131 is provided on the insulating layer 161.

Note that the substrate 100, the first electrode 110, the organic light emitting layer 140, the second electrode 150, the protective layer 160, the color filter 171, and the shielding layer 173 are substantially similar to the first configuration, and thus the description thereof will be omitted.

The insulating layer 161 is provided between the respective adjacent first electrodes 110 to separate each of the light emitting elements. Furthermore, the insulating layer 161 is provided to protrude further than the first electrode 110 and forms a concave structure in which the first electrode 110 is a bottom portion. Accordingly, the channel formation layer 121 as described later can be formed on the first electrode 110 along the side surface of the insulating layer 161.

The insulating layer 161 may include an inorganic-based insulating material, and specifically may include either an inorganic nitride or an inorganic oxide. For example, the insulating layer 161 may include a single layer film or a stacked film including any of silicon oxide ($SiO_x$), silicon nitride ($SiN_x$) or silicon oxynitride (SiON).

Note that the insulating layer 161 may include the same material as the channel block layer 131 as described later. For example, the insulating layer 161 may include an inorganic nitride which does not contain oxygen, such as silicon nitride ($SiN_x$). In such a case, the production step of the display device can be further simplified by simultaneously forming the insulating layer 161 and the channel block layer 131, as a result of which the productivity of the display device can be improved.

A light reflecting portion which reflects the light emitted from the organic light emitting layer 140 may be provided inside the insulating layer 161. The light reflecting portion reflects the light emitted from the organic light emitting layer 140 toward the insulating layer 161 positioned on the side surface of the concave structure to the opening side of the concave structure, so that it is possible to improve the light extraction efficiency of the light emitting element. Furthermore, the light reflecting portion can suppress the entering of the light emitted from the organic light emitting layer 140 into the adjacent light emitting elements, so that it is possible to prevent the occurrence of color mixing between the respective light emitting elements.

The light reflecting portion may include, for example, a single metal or an alloy of metals such as Cr, Au, Pt, Ni, Cu, Mo, W, Ti, Ta, Al, Fe or Ag. However, in a case where the light reflecting portion includes a single metal or an alloy of metals, parasitic capacitance may occur between the light reflecting portion and the first electrode 110. Therefore, in such a case, it is desirable that the light reflecting portion prevents the generation of parasitic capacitance by reducing the potential to the ground.

Furthermore, the light reflecting portion may include a material having a smaller refractive index than the insulating layer 161, or may be an air gap having a relative dielectric constant of 1. In such a case, the light reflecting portion can serve as a reflection portion that totally reflects incident light, because the magnitude relationship of the refractive index with the insulating layer 161 satisfies the condition of total reflection.

The channel formation layer 121 is formed on the first electrode 110 along the side surface of the insulating layer 161 and is formed on the side surface of the concave structure in which the first electrode 110 is a bottom portion. In other words, in this specific example, the channel formation layer 121 corresponds to the first inorganic insulating layer 120 in the first configuration. Furthermore, in the display device according to this specific example, the concave structure formed by the first electrode 110 and the channel formation layers 121 is the light emitting region of the light emitting element.

Figure 6:
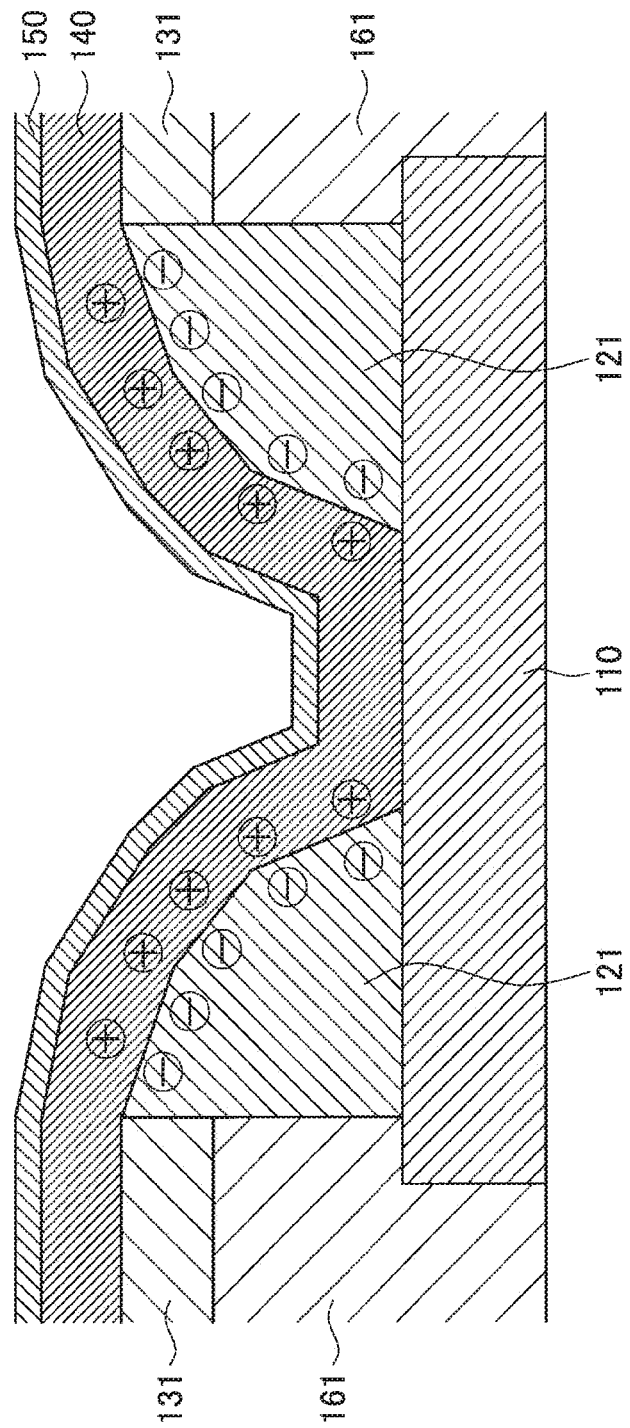
FIG. 6 is an enlarged sectional view of one of the light emitting elements of FIG. 5.

Here, the function of the channel formation layer 121 will be described with reference to FIG. 6. FIG. 6 is an enlarged sectional view of one of the light emitting elements of FIG. 5.

As illustrated in FIG. 6, since the surface of the channel formation layer 121 is negatively charged by a high concentration of hydroxy groups, holes having a positive charge are attracted to the interface of the organic light emitting layer 140 in contact with the channel formation layer 121, and the holes accumulate at the interface. The region in which such holes have accumulated has a low resistance, and serve as a conductive path through which current can flow with the holes as carriers. In other words, the channel formation layer 121 can form a channel in which the holes have accumulated at the interface of the organic light emitting layer 140 in contact with the channel formation layer 121. The channel can lower the barrier of hole injection from the first electrode 110 to the organic light emitting layer 140, so that it is possible to decrease the drive voltage of the light emitting element and to decrease the power consumption of the light emitting element.

Furthermore, the channel formation layer 121 desirably includes a material having a smaller refractive index than the organic light emitting layer 140. In a case where the refractive index of the channel formation layer 121 is smaller than the refractive index of the organic light emitting layer 140, the interface between the organic light emitting layer 140 and the channel formation layer 121 satisfies the total reflection condition, and serves as a reflector which reflects the light emitted from the organic light emitting layer 140. According to this, the light emitting element reflects the light emitted from the organic light emitting layer 140 toward the channel formation layer 121 at the interface between the organic light emitting layer 140 and the channel formation layer 121, so that it is possible to increase the light to be emitted toward the color filter 171 side. Accordingly, the channel formation layer 121 is formed using a material having a smaller refractive index than the organic light emitting layer 140, as a result of which the light emitting element can improve the light extraction efficiency from the organic light emitting layer 140.

In particular, in the light emitting element according to this embodiment, a concave structure is formed by the first electrode 110 and the channel formation layer 121. Accordingly, the light emitting element uses the interface between the channel formation layer 121 and the organic light emitting layer 140 as a reflector, so that it is possible to extract more light emitted from the organic light emitting layer 140.

The channel block layer 131 is provided on the insulating layer 161 and prevents the formation of a channel in the organic light emitting layer 140 in contact with the channel block layer 131, thereby preventing the occurrence of leakage current between the light emitting elements. In other words, in this specific example, the channel block layer 131 corresponds to the second inorganic insulating layer 130 mentioned above.

Specifically, as illustrated in FIG. 6, the surface of the channel block layer 131 is not negatively charged, whereby no holes are attracted to the interface of the organic light emitting layer 140 in contact with the channel block layer 131. Accordingly, no channel is formed in the organic light emitting layer 140 in contact with the channel block layer 131, so that it is possible to prevent a short circuit of the first electrode 110 between adjacent light emitting elements.

Furthermore, the channel block layer 131 may include a stacked film of a film including an inorganic oxide and a film including an inorganic nitride. In such a case, even if the film including inorganic oxide is in contact with the organic light emitting layer 140, the negative charge generated in the film including inorganic oxide is eliminated by positively charging the film including inorganic nitride. Thus, it is possible to prevent the channel from being formed in the organic light emitting layer 140. For example, the channel block layer 131 may include a stacked film in which positively charged silicon nitride ($SiN_x$) and negatively charged silicon oxide ($SiO_x$) are sequentially stacked from the insulating layer 161 side.

Note that, in this specific example, the second electrode 150 is not necessarily continuously formed on the organic light emitting layer 140. Specifically, since atoms are less likely to reach the bottom portion of the concave structure at the time of film formation, the second electrode 150 is not necessarily formed in a region corresponding to the bottom portion of the concave structure formed by the first electrode 110 and the channel formation layer 121. Furthermore, the region corresponding to the bottom portion of the concave structure applies an electric field to the organic light emitting layer 140 between the second electrode 150 and the first electrode 110, and thus is less efficient in hole injection than other regions which apply an electric field to the organic light emitting layer 140 between the second electrode 150 and the channel. Therefore, in a case where the second electrode 150 is not formed in the region corresponding to the bottom portion of the concave structure, the light emission efficiency of the light emitting element is not significantly reduced.

As described above, in the display device according to this specific example, the channel formation layer 121 can form a channel with a low barrier for hole injection to the organic light emitting layer 140, and thus the power consumption can be decreased by decreasing the drive voltage of the light emitting element. Furthermore, in the display device according to this specific example, a concave structure can be formed by the first electrode 110 and the channel formation layer 121, and the channel formation layer 121 or the insulating layer 161 on the side surface of the concave structure may be used as a reflector. Accordingly, in the display device according to this specific example, the light from the organic light emitting layer 140 is reflected by the channel formation layer 121 or the insulating layer 161 on the side surface of the concave structure, as a result of which it is possible to improve the light extraction efficiency from the light emitting element.

1.4. Modified Example

Figure 7:
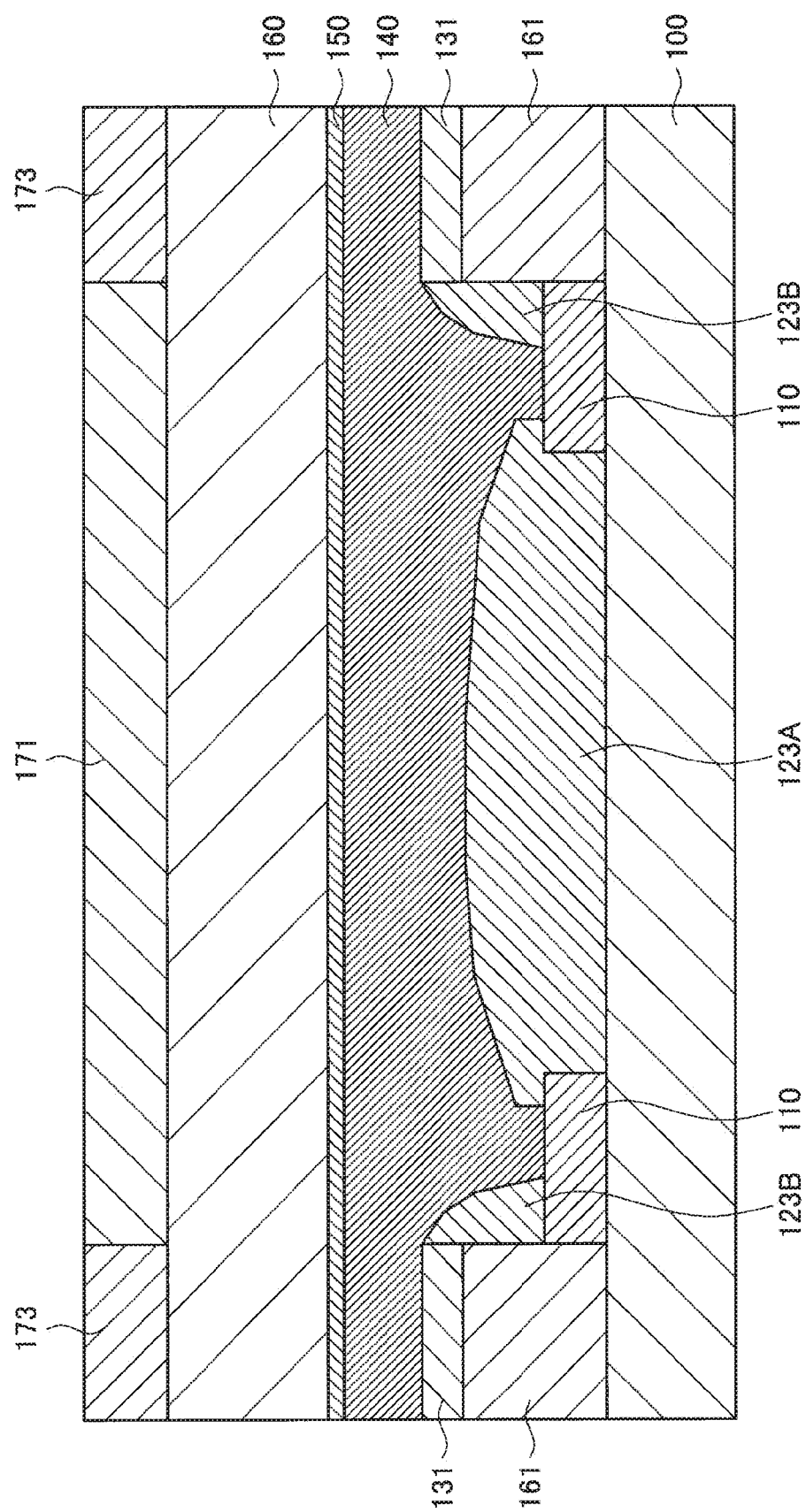
FIG. 7 is a cross-sectional view of light emitting elements cut in a stacking direction which are included in a modified example of the display device illustrated in FIG. 5.

Next, a modified example of the display device illustrated in FIG. 5 will be described with reference to FIG. 7. FIG. 7 is a cross-sectional view of light emitting elements cut in a stacking direction which are included in a modified example of the display device illustrated in FIG. 5.

As illustrated in FIG. 7, the light emitting elements include: the substrate 100; a plurality of first electrodes 110 provided on the substrate 100 separately for each of the light emitting elements; a first channel formation layer 123A provided between the plurality of first electrodes 110; an insulating layer 161 and a channel block layer 131 which are provided between the light emitting elements; a second channel formation layer 123B provided as a sidewall of the insulating layer 161 and the channel block layer 131; an organic light emitting layer 140 provided over the whole surface of the substrate 100; a second electrode 150 provided on the organic light emitting layer 140; a protective layer 160 provided on the second electrode 150; and a color filter 171 and a shielding layer 173 which are provided on the protective layer 160.

In other words, a difference between the display device according to this modified example and the display device according to the specific example illustrated in FIG. 5 is that the display device according to this modified example includes the first electrodes 110 in which the light emitting regions of the light emitting elements are separately from each other and the first channel formation layer 123A provided between the plurality of first electrodes 110.

Note that the difference between the display device according to this modified example and the display device according to the specific example will be described hereinbelow. In the display device according to this modified example, the configurations not mentioned below are substantially similar to the configurations of the display device according to the specific example mentioned above.

The first channel formation layer 123A and the second channel formation layer 123B include the material similar to the channel formation layer 121 described in the display device according to the specific example mentioned above. The first channel formation layer 123A and the second channel formation layer 123B are negatively charged, so that a channel having holes as carriers can be formed at the interface of the organic light emitting layer 140 in contact with the first channel formation layer 123A and the second channel formation layer 123B.

The channel formed by the first channel formation layer 123A and the second channel formation layer 123B includes holes as free carriers, and thus has smaller resistance and higher electrical conductivity than the first electrode 110. Furthermore, the channel formed by the first channel formation layer 123A and the second channel formation layer 123B has a lower hole injection barrier to the organic light emitting layer 140 than the first electrode 110. Accordingly, the channel formed by the first channel formation layer 123A and the second channel formation layer 123B is mainly used instead of the first electrode 110 as the anode of the light emitting element, so that the drive voltage of the light emitting element can be further decreased, and thus the power consumption can be decreased.

Consequently, in the display device according to this modified example, the channel formed by the first channel formation layer 123A and the second channel formation layer 123B may be used in place of the first electrode 110. Furthermore, in the display device according to this modified example, the drive voltage of the light emitting element is further decreased, and thus the power consumption can be decreased.

2. Method of Producing Display Device

Subsequently, a method of producing the display device according to the specific example mentioned above will be described with reference to FIGS. 8 to 15. FIGS. 8 to 15 are cross-sectional views illustrating each step of the method of producing the display device illustrated in FIG. 5.

Figure 8:
FIG. 8 is a cross-sectional view illustrating a step of a method of producing the display device illustrated in FIG. 5.

First, the substrate 100 is prepared as illustrated in FIG. 8. Although not illustrated in FIG. 8, the substrate 100 is provided with a driver circuit which controls driving of light emitting elements formed on the substrate 100, a power circuit which supplies power to the light emitting elements, and the like. For example, the substrate 100 may be a silicon substrate in which a transistor or the like can be easily formed.

Figure 9:
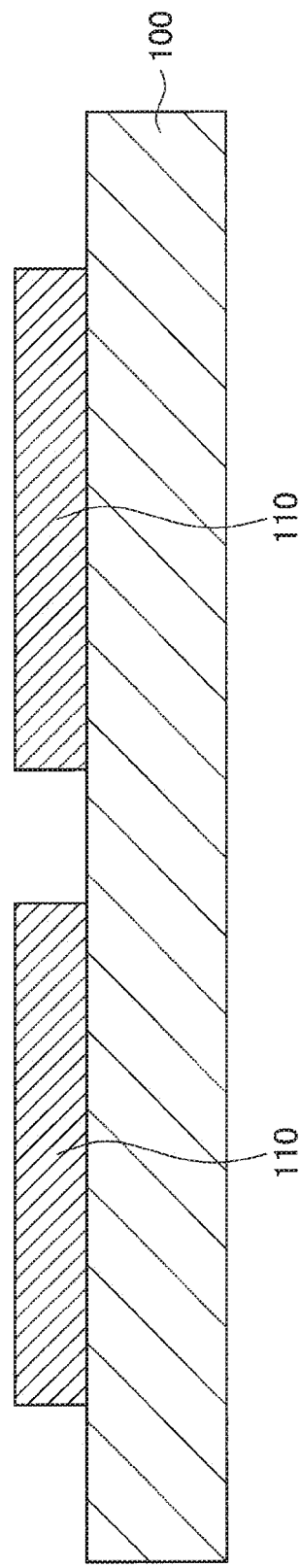
FIG. 9 is a cross-sectional view illustrating a step of the method of producing the display device illustrated in FIG. 5.

Next, as illustrated in FIG. 9, the first electrodes 110 are formed on the substrate 100 for each of the light emitting elements using sputtering or the like. For example, the first electrodes 110 may include an aluminum copper alloy (AlCu).

Figure 10:
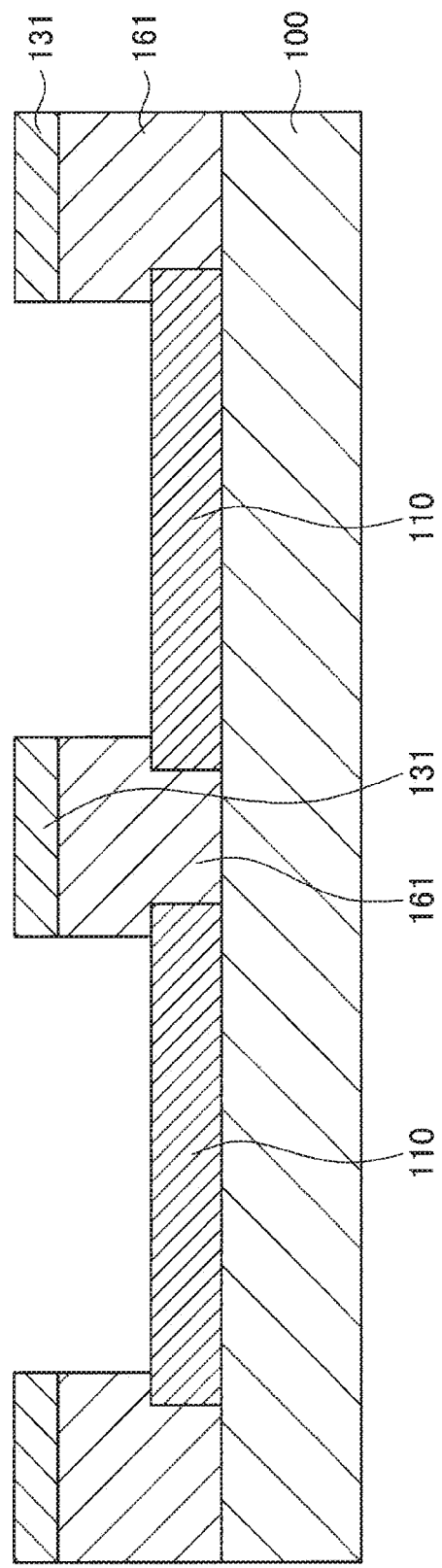
FIG. 10 is a cross-sectional view illustrating a step of the method of producing the display device illustrated in FIG. 5.

Subsequently, as illustrated in FIG. 10, the insulating layer 161 and the channel block layer 131 are sequentially formed between the respective first electrodes 110 using CVD or the like. Furthermore, the insulating layer 161 and the channel block layer 131 are formed to have a film thickness thicker than the first electrode 110. Thus, the channel formation layer 121 can be formed on the side surfaces of the insulating layer 161 and the channel block layer 131 in a later step.

For example, the insulating layer 161 may include silicon nitride ($SiN_x$, and the channel block layer 131 may include aluminum oxide ($Al_2O_3$). Furthermore, the insulating layer 161 and the channel block layer 131 may simultaneously include silicon nitride ($SiN_x$).

Figure 11:
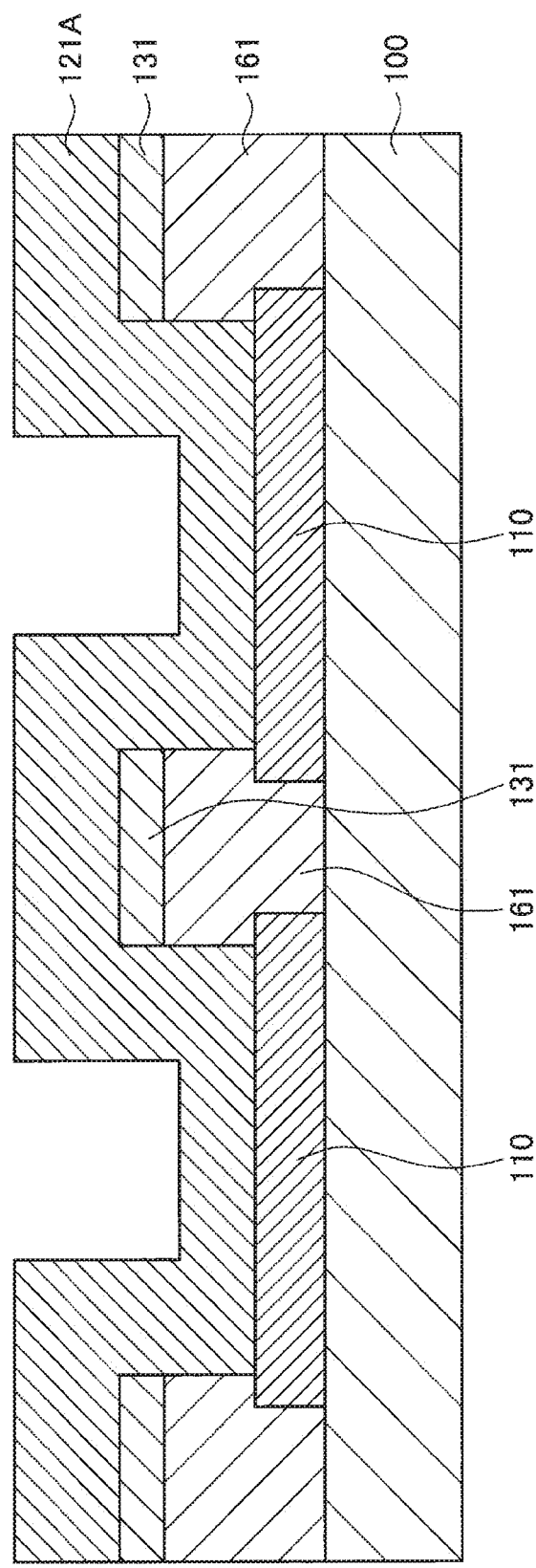
FIG. 11 is a cross-sectional view illustrating a step of the method of producing the display device illustrated in FIG. 5.

Next, as illustrated in FIG. 11, a sidewall material layer 121A is formed on the first electrode 110 and the channel block layer 131 using low temperature plasma CVD. The sidewall material layer 121A is a layer that serves as the channel formation layer 121 through dry etching as described later, and may include, for example, silicon oxide ($SiO_x$).

Figure 12:
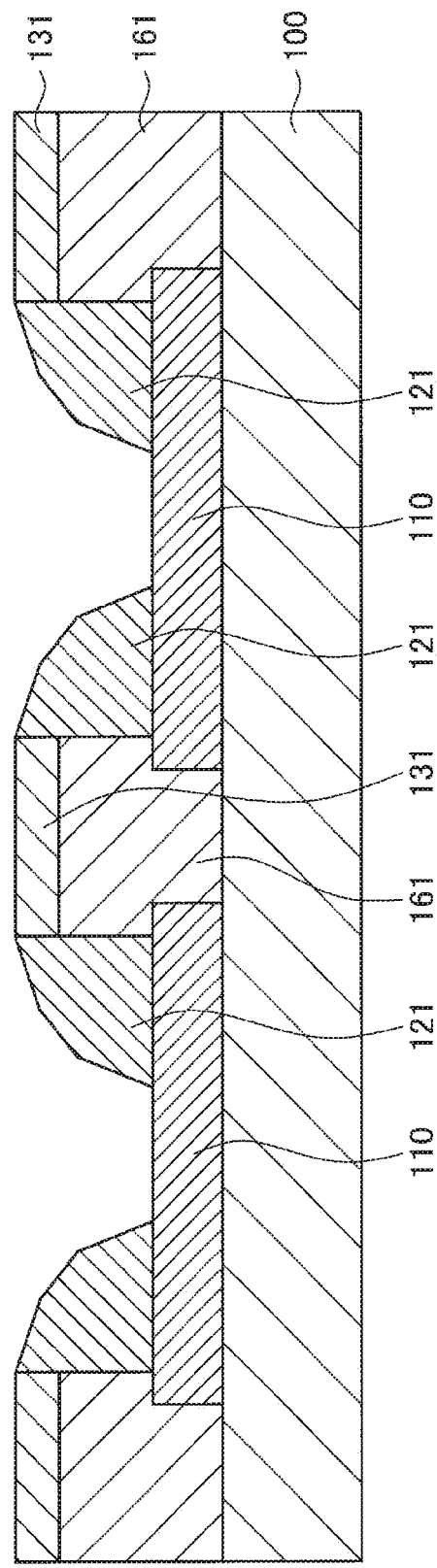
FIG. 12 is a cross-sectional view illustrating a step of the method of producing the display device illustrated in FIG. 5.

Subsequently, as illustrated in FIG. 12, the channel formation layer 121 is formed by etching the whole sidewall material layer 121A using dry etching having vertical anisotropy. In dry etching having vertical anisotropy, the sidewall material layer 121A is not isotropically etched. Therefore, the sidewall material layer 121A in the vicinity of the side surfaces of the insulating layer 161 and the channel block layer 131 remains without being etched, and forms the channel formation layer 121. In other words, the channel formation layer 121 is formed as a sidewall of the insulating layer 161 and the channel block layer 131.

Therefore, in the method of producing the display device according to this specific example, the channel formation layer 121 is formed on the first electrode 110 in a self-aligned manner (so-called self-alignment). Furthermore, the shape of the channel formation layer 121 can be controlled by the film thicknesses of the insulating layer 161, the channel block layer 131, and the sidewall material layer 121A. In CVD and sputtering, it is easy to control the film thickness. Thus, according to the method of producing the display device according to this specific example, it is possible to more precisely control the shape and size of the channel formation layer 121.

Figure 13:
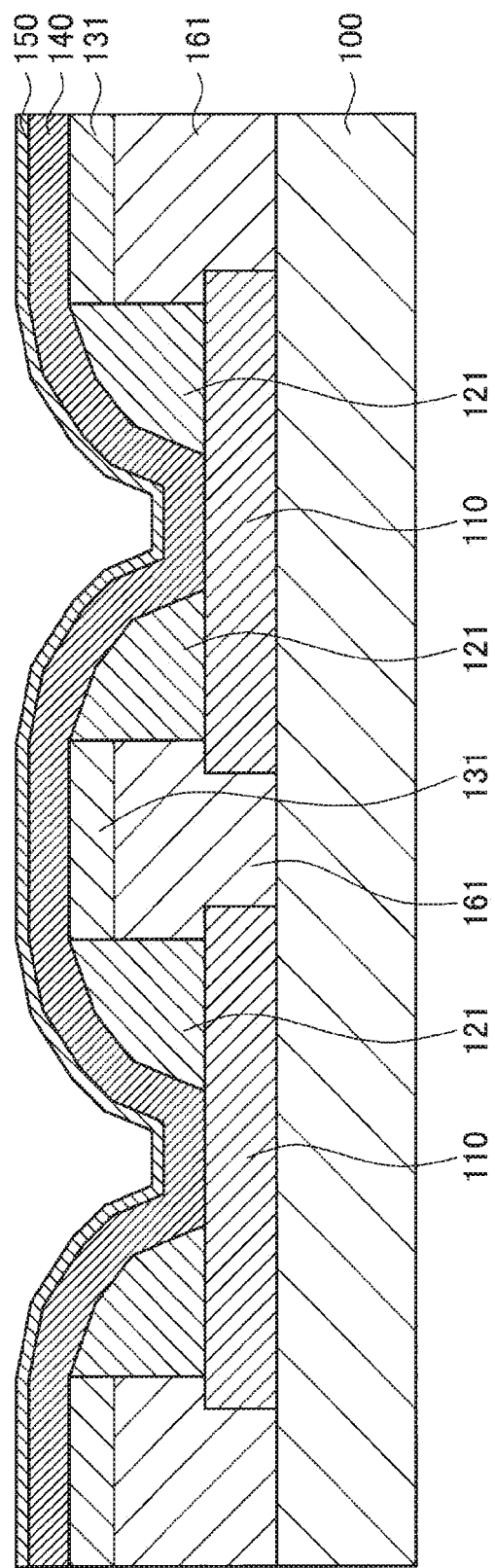
FIG. 13 is a cross-sectional view illustrating a step of the method of producing the display device illustrated in FIG. 5.

Next, as illustrated in FIG. 13, the organic light emitting layer 140 and the second electrode 150 are sequentially formed over the whole surfaces of the first electrode 110, the channel formation layer 121, and the channel block layer 131. For example, the organic light emitting layer 140 may be formed by sequentially depositing the hole injection layer, the hole transport layer, the light emitting layer, the electron transport layer, and the electron injection layer from the first electrode 110 side, using a vacuum deposition method or the like. As materials for forming each of the layers, for example, the materials mentioned above can be used. Furthermore, the second electrode 150 may be formed by depositing indium zinc oxide using sputtering or the like.

Figure 14:
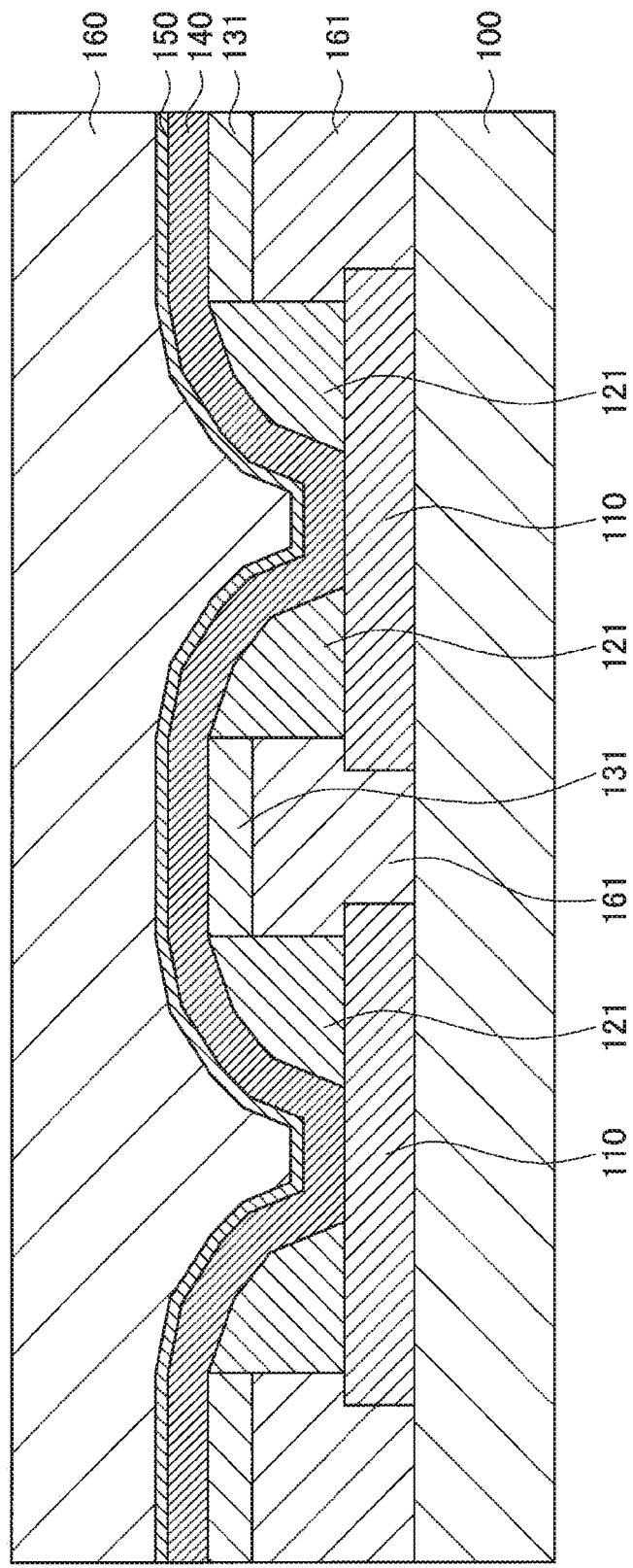
FIG. 14 is a cross-sectional view illustrating a step of the method of producing the display device illustrated in FIG. 5.

Subsequently, as illustrated in FIG. 14, the protective layer 160 is formed on the second electrode 150 using CVD or the like. For example, the protective layer 160 may include silicon oxide ($SiO_x$), silicon nitride ($SiN_x$), silicon oxynitride (SiON) or the like.

Figure 15:
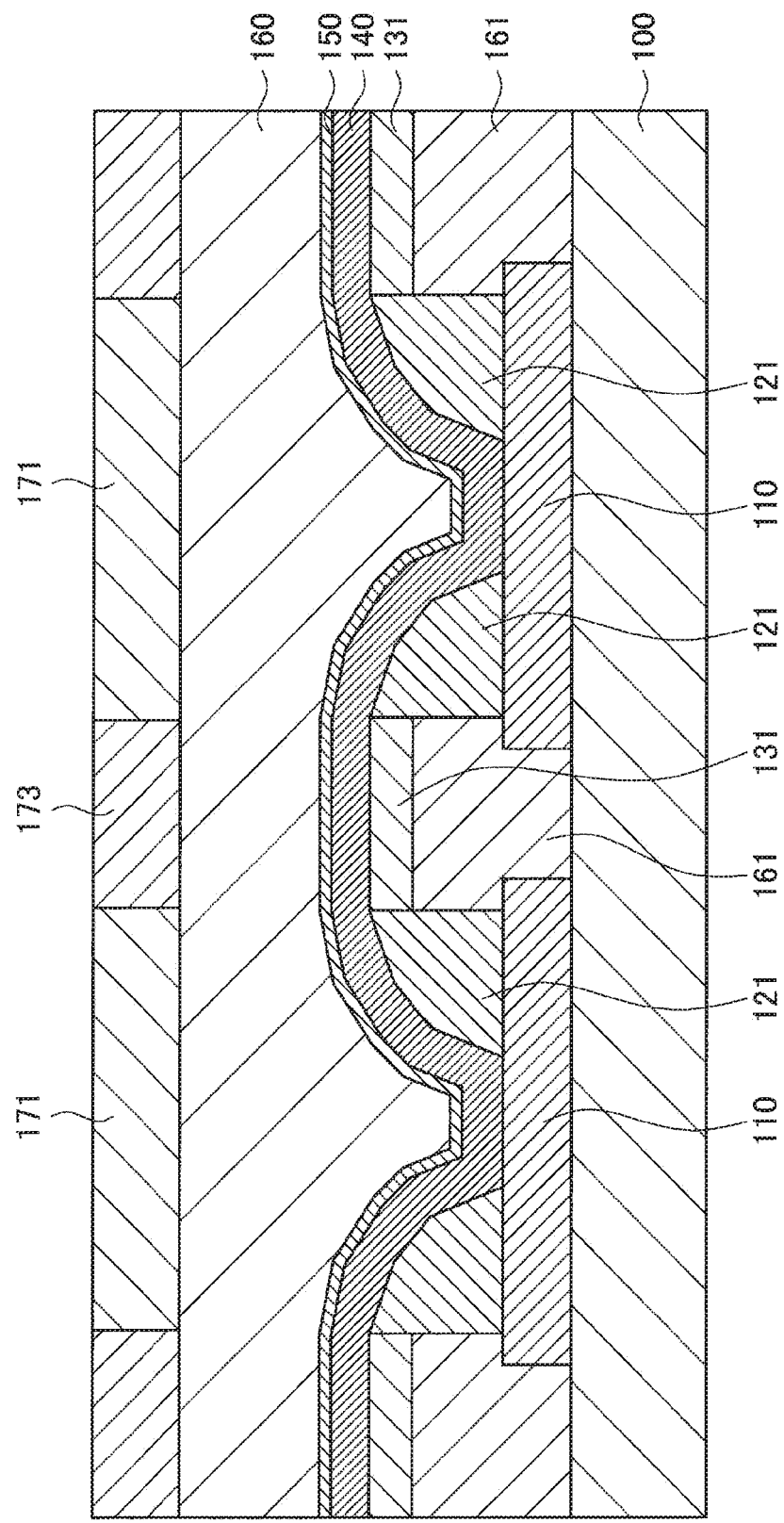
FIG. 15 is a cross-sectional view illustrating a step of the method of producing the display device illustrated in FIG. 5.

Next, as illustrated in FIG. 15, the color filter 171 and the shielding layer 173 are formed on the protective layer 160 by patterning using photolithography or the like. Specifically, the shielding layer 173 is first formed on the whole surface of the protective layer 160, and then an opening is formed in the shielding layer 173 by patterning for each pixel or sub-pixel using photolithography or the like. Thereafter, the color filter 171 and the shielding layer 173 can be formed by forming the color filter 171 corresponding to each color in the opening of the shielding layer 173.

The display device according to this specific example can be produced by the above-described steps. According to the above production method, the channel formation layer 121 can be formed in a self-aligned manner without using a mask or the like. Furthermore, according to the above production method, the shape of the channel formation layer 121 can be controlled by the film thicknesses of the insulating layer 161, the channel block layer 131, and the sidewall material layer 121A. Accordingly, in the method of producing a display device according to this specific example, it is easy to miniaturize the light emitting element included in the display device, and it is possible to produce a higher-definition display device without increasing the cost.

3. Application Examples of Display Device

Subsequently, application examples of the display device according to an embodiment of the present disclosure will be described with reference to FIGS. 16 to 19. FIGS. 16 to 19 are external views each illustrating an example of an electronic device to which the display device according to this embodiment can be applied.

Figure 16:
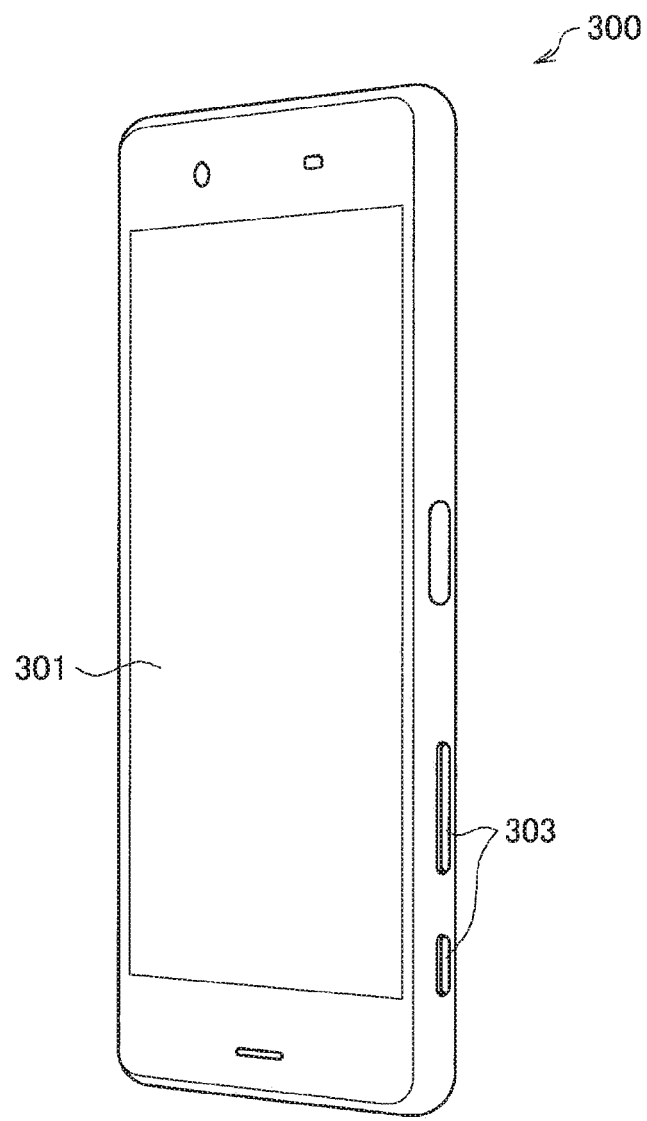
FIG. 16 is an external view illustrating an example of an electronic device to which the display device according to an embodiment of the present disclosure can be applied.

For example, the display device according to this embodiment can be applied to a display unit of an electronic device such as a smartphone. Specifically, as illustrated in FIG. 16, a smartphone 300 includes a display unit 301 which displays various information and an operation unit 303 which includes a button or the like for receiving an operation input by a user. Here, the display unit 301 may be configured by the display device according to this embodiment.

Figure 17:
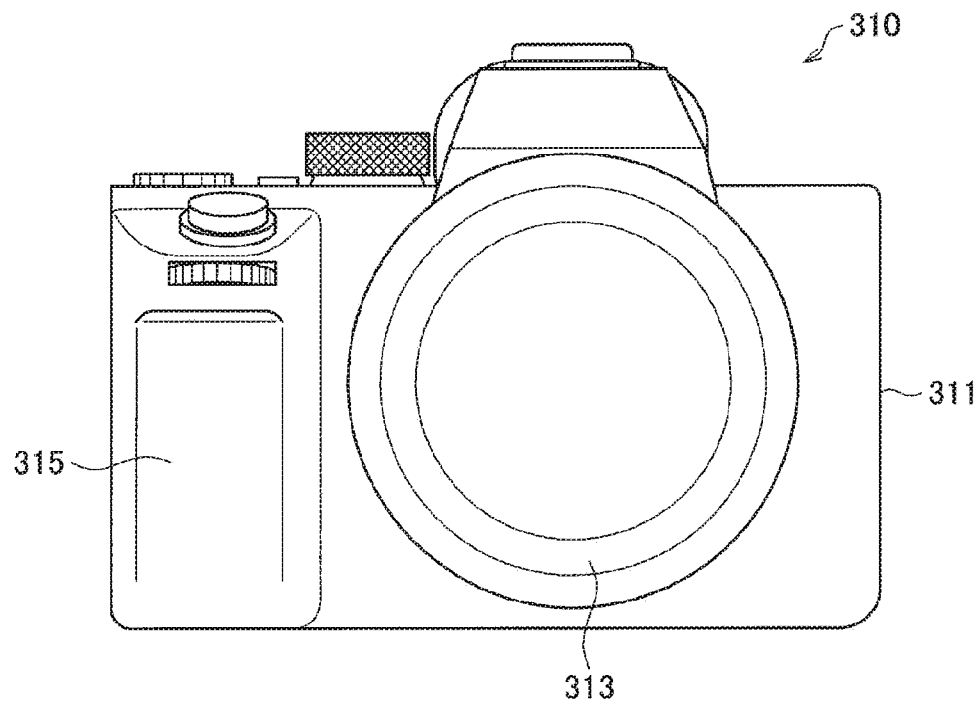
FIG. 17 is an external view illustrating another example of the electronic device to which the display device according to an embodiment of the present disclosure can be applied.
Figure 18:
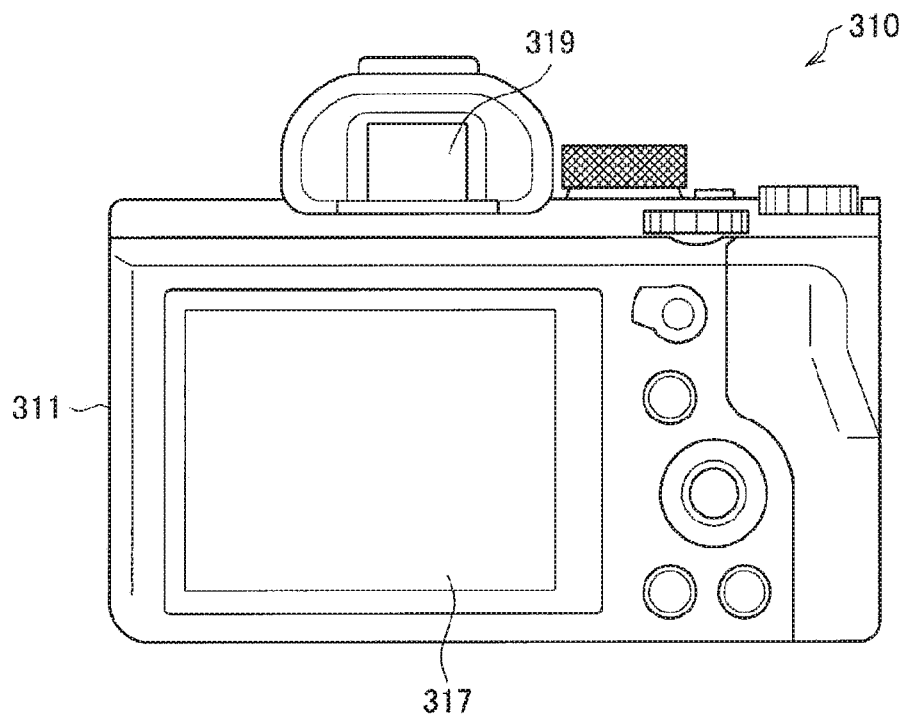
FIG. 18 is an external view illustrating another example of the electronic device to which the display device according to an embodiment of the present disclosure can be applied.

Furthermore, for example, the display device according to this embodiment can be applied to a display unit of an electronic device such as a digital camera. Specifically, as illustrated in FIGS. 17 and 18, a digital camera 310 includes a main body portion (camera body) 311, an interchangeable lens unit 313, a grip portion 315 which is held by the user at the time of photographing, a monitor unit 317 which displays various information, and an electronic view finder (EVF) 319 which displays a through image observed by the user at the time of shooting. Note that FIG. 17 illustrates the appearance of the digital camera 310 viewed from the front (in other words, the object side), and FIG. 18 illustrates the appearance of the digital camera 310 viewed from the rear (in other words, the photographer side). Here, the monitor unit 317 and the EVF 319 may be configured by the display device according to this embodiment.

Furthermore, for example, the display device according to this embodiment can be applied to a display unit of an electronic device such as a head mounted display (HMD).

Figure 19:
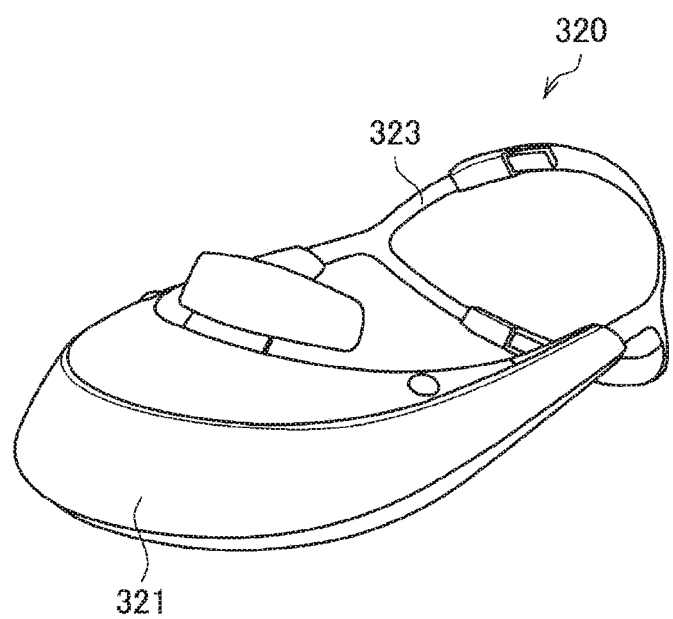
FIG. 19 is an external view illustrating another example of the electronic device to which the display device according to an embodiment of the present disclosure can be applied.

Specifically, as illustrated in FIG. 19, the HMD 320 includes a display unit 321 which displays various information, and a mounting portion 323 which is mounted on the head of the user at the time of mounting. Here, the display unit 321 may be configured by the display device according to this embodiment. Moreover, the display device according to this embodiment can be applied not only to the non-transmissive HMD illustrated in FIG. 19 but also to a display unit of a transmissive HMD such as a glasses type.

Note that the electronic device to which the display device according to this embodiment can be applied is not limited to the above examples. The display device according to this embodiment can be applied to a display unit of an electronic device in any field that performs display on the basis of an image signal input from the outside or an image signal generated internally. Examples of the electronic device include a television device, an electronic book, a personal digital assistant (PDA), a laptop personal computer, a video camera, a game device, and the like.

Although the preferred embodiments of the present disclosure have been described in detail with reference to the accompanying drawings, the technical scope of the present disclosure is not limited to such examples. It is obvious that those skilled in the art of the present disclosure can conceive various alterations or modifications within the scope of the technical idea described in the claims, and it is understood that these alterations or modifications are of course included in the technical scope of the present disclosure.

Furthermore, the effects described in the present specification are merely illustrative or demonstrative, and not limitative. That is, the technique according to the present disclosure can exhibit other effects which are obvious to those skilled in the art based on the description of the present specification, along with or instead of the effects described above.

Note that the following configuration is also within the technical scope of the present disclosure.

(1)

A display device including:

a first electrode provided for each of a plurality of light emitting elements arranged on a flat surface;

at least two or more kinds of inorganic insulating layers which separate each of the light emitting elements and have different concentrations of hydroxy groups on surfaces of the layers;

an organic light emitting layer provided on the first electrode and the two or more kinds of inorganic insulating layers; and a second electrode provided on the organic light emitting layer.

(2)

The display device according to (1), in which the two or more kinds of inorganic insulating layers include: first inorganic insulating layers provided on both sides of the first electrode; and a second inorganic insulating layer which is provided between the first inorganic insulating layer and the first inorganic insulating layer of an adjacent light emitting element and which has a lower concentration of hydroxy groups on a surface than a concentration of hydroxy groups on a surface of the first inorganic insulating layer.

(3)

The display device according to (2), in which a channel using holes as carriers is formed at an interface of the organic light emitting layer in contact with the first inorganic insulating layer, and the channel is not formed at an interface of the organic light emitting layer in contact with the second inorganic insulating layer.

(4)

The display device according to (3), further including an electron accumulation layer provided between the first electrode and the two or more kinds of inorganic insulating layers, and the organic light emitting layer, in which the two or more kinds of inorganic insulating layers include second inorganic insulating layers provided on both sides of the first electrode and a first inorganic insulating layer which is provided between the second inorganic insulating layer and the second inorganic insulating layer of an adjacent light emitting element and which has a higher concentration of hydroxy groups on a surface than the concentration of hydroxy groups on the surface of the first inorganic insulating layer.

(5)

The display device according to (4), in which a channel having electrons as carriers is formed in the electron accumulation layer in contact with the second inorganic insulating layer, and the channel is not formed in the electron accumulation layer in contact with the first inorganic insulating layer.

(6)

The display device according to (4) or (5), in which an absolute value of a LUMO level of the electron accumulation layer is larger than an absolute value of a HOMO level of the organic light emitting layer in contact with the electron accumulation layer, and is larger than a work function of a material which forms the first electrode.

(7)

The display device according to any one of (1) to (6), in which the organic light emitting layer is provided continuously over the plurality of light emitting elements.

(8)

The display device according to (7), in which the second electrode is provided continuously over the plurality of light emitting elements.

(9)

The display device according to (2) or (3), in which the first inorganic insulating layer is provided on the first electrode along a side surface of the second inorganic insulating layer which is provided to protrude further than the first electrode, and the first electrode and the first inorganic insulating layer form a concave structure.

(10)

The display device according to (9), in which the inside of the concave structure is a light emitting region.

(11)

The display device according to (9) or (10), in which a refractive index of the first inorganic insulating layer is smaller than a refractive index of the organic light emitting layer.

(12)

The display device according to any one of (9) to (11), in which a light reflecting portion which reflects light from the organic light emitting layer is provided inside the second inorganic insulating layer.

(13)

The display device according to any one of (9) to (12), in which the second inorganic insulating layer includes an inorganic nitride which does not contain oxygen.

(14)

The display device according to (13), in which the second inorganic insulating layer includes $SiN_x$.

(15)

The display device according to any one of (9) to (14), in which the first inorganic insulating layer includes $SiO_x$ or SiON.

(16)

An electronic device including a display unit, the display unit including:

a first electrode provided for each of a plurality of light emitting elements arranged on a flat surface;

at least two or more kinds of inorganic insulating layers which separate each of the light emitting elements and have different concentrations of hydroxy groups on surfaces of the layers;

an organic light emitting layer provided on the first electrode and the two or more kinds of inorganic insulating layers; and a second electrode provided on the organic light emitting layer.

(17)

A method of producing a display device, including the steps of:

respectively forming first electrodes on a flat surface;

forming, between the first electrodes, a second inorganic insulating layer which protrudes further than the first electrodes;

forming an inorganic insulating material layer having a higher concentration of hydroxy groups on a surface than a concentration of hydroxy groups on a surface of the second inorganic insulating layer, on the first electrodes and the second inorganic insulating layer;

anisotropically etching the inorganic insulating material layer to form a first inorganic insulating layer along a side surface of the second inorganic insulating layer;

forming an organic light emitting layer on the first electrodes, the first inorganic insulating layer, and the second inorganic insulating layer; and forming a second electrode on the organic light emitting layer.

REFERENCE SIGNS LIST

100 Substrate
110 First electrode
120 First inorganic insulating layer
130 Second inorganic insulating layer
140 Organic light emitting layer
150 Second electrode
160 Protective layer
171 Color filter
173 Shielding layer

The invention claimed is:

1. A display device, comprising:
a first electrode provided for each of a plurality of light emitting elements arranged on a flat surface;
at least two kinds of inorganic insulating layers which separate each of the plurality of light emitting elements and have different concentrations of hydroxy groups on surfaces of the at least tow kinds of inorganic insulating layers;
an organic light emitting layer provided on the first electrode and the at least two kinds of inorganic insulating layers; and
a second electrode provided on the organic light emitting layer.

2. The display device according to claim 1, wherein the at least two kinds of inorganic insulating layers include: a first inorganic insulating layer provided on both sides of the first electrode; and a second inorganic insulating layer which is provided between the first inorganic insulating layer and the first inorganic insulating layer of an adjacent light emitting element and which has a lower concentration of the hydroxy groups on a surface than a concentration of the hydroxy groups on a surface of the first inorganic insulating layer.

3. The display device according to claim 2, wherein a channel using holes as carriers is formed at an interface of the organic light emitting layer in contact with the first inorganic insulating layer, and the channel is not formed at an interface of the organic light emitting layer in contact with the second inorganic insulating layer.

4. The display device according to claim 3, further comprising
an electron accumulation layer provided between the first electrode and the at least two kinds of inorganic insulating layers, and the organic light emitting layer,
wherein the at least two kinds of inorganic insulating layers include second inorganic insulating layers provided on both sides of the first electrode and the first inorganic insulating layer which is provided between the second inorganic insulating layer and the second inorganic insulating layer of the adjacent light emitting element and which has a higher concentration of the hydroxy groups on a surface than the concentration of the hydroxy groups on the surface of the first inorganic insulating layer.

5. The display device according to claim 4, wherein a channel having electrons as carriers is formed in the electron accumulation layer in contact with the second inorganic insulating layer, and the channel is not formed in the electron accumulation layer in contact with the first inorganic insulating layer.

6. The display device according to claim 4, wherein an absolute value of a LUMO level of the electron accumulation layer is larger than an absolute value of a HOMO level of the organic light emitting layer in contact with the electron accumulation layer, and is larger than a work function of a material which forms the first electrode.

7. The display device according to claim 1, wherein the organic light emitting layer is provided continuously over the plurality of light emitting elements.

8. The display device according to claim 7, wherein the second electrode is provided continuously over the plurality of light emitting elements.

9. The display device according to claim 2, wherein the first inorganic insulating layer is provided on the first electrode along a side surface of the second inorganic insulating layer which is provided to protrude further than the first electrode, and
the first electrode and the first inorganic insulating layer form a concave structure.

10. The display device according to claim 9, wherein an inside of the concave structure is a light emitting region.

11. The display device according to claim 9, wherein a refractive index of the first inorganic insulating layer is smaller than a refractive index of the organic light emitting layer.

12. The display device according to claim 9, wherein a light reflecting portion which reflects light from the organic light emitting layer is provided inside the second inorganic insulating layer.

13. The display device according to claim 9, wherein the second inorganic insulating layer includes an inorganic nitride which does not contain oxygen.

14. The display device according to claim 13, wherein the second inorganic insulating layer includes $SiN_x$.

15. The display device according to claim 9, wherein the first inorganic insulating layer includes $SiO_x$ or SiON.

16. An electronic device comprising a display unit, the display unit including:
- a first electrode provided for each of a plurality of light emitting elements arranged on a flat surface;
- at least two kinds of inorganic insulating layers which separate each of the plurality of light emitting elements and have different concentrations of hydroxy groups on surfaces of the at least tow kinds of inoranice insulating layers;
- an organic light emitting layer provided on the first electrode and the at least two kinds of inorganic insulating layers; and
- a second electrode provided on the organic light emitting layer.

17. A method of producing a display device, comprising:
respectively forming first electrodes on a flat surface;
forming, between the first electrodes, a second inorganic insulating layer which protrudes further than the first electrodes;
forming an inorganic insulating material layer having a higher concentration of hydroxy groups on a surface than a concentration of the hydroxy groups on a surface of the second inorganic insulating layer, on the first electrodes and the second inorganic insulating layer;
anisotropically etching the inorganic insulating material layer to form a first inorganic insulating layer along a side surface of the second inorganic insulating layer;
forming an organic light emitting layer on the first electrodes, the first inorganic insulating layer, and the second inorganic insulating layer; and
forming a second electrode on the organic light emitting layer.

\* \* \* \* \*